US012812778B2

(12) United States Patent
Neely et al.

(10) Patent No.: US 12,812,778 B2
(45) Date of Patent: Nov. 24, 2026

(54) SYSTEMS AND METHODS FOR REMOVING UNDESIRED METAL WITHIN VIAS FROM PRINTED CIRCUIT BOARDS

(71) Applicant: TTM TECHNOLOGIES INC., Santa Ana, CA (US)

(72) Inventors: Matthew Douglas Neely, Endicott, NY (US); John Konrad, Endicott, NY (US); Mace Lehrer, San Diego, CA (US)

(73) Assignee: TTM Technologies Inc., Santa Ana, CA (US)

(*) Notice: Subject to any disclaimer, the term of this patent is extended or adjusted under 35 U.S.C. 154(b) by 734 days.

(21) Appl. No.: 17/511,333

(22) Filed: Oct. 26, 2021

(65) Prior Publication Data

US 2022/0053641 A1 Feb. 17, 2022

Related U.S. Application Data

(63) Continuation-in-part of application No. 17/092,080, filed on Nov. 6, 2020, now Pat. No. 11,997,800.

(Continued)

(51) Int. Cl.

| | |
|---|---|
| ***H05K 1/11*** | (2006.01) |
| ***H05K 1/09*** | (2006.01) |
| ***H05K 3/42*** | (2006.01) |

(52) U.S. Cl.

CPC ............... *H05K 1/115* (2013.01); *H05K 1/09* (2013.01); *H05K 3/429* (2013.01); *H05K 2201/09645* (2013.01)

(58) Field of Classification Search

CPC ......... H05K 2201/09645; H05K 3/429; H05K 2203/0242

See application file for complete search history.

(56) References Cited

U.S. PATENT DOCUMENTS 4,708,545 A * 11/1987 Fujii ...................... B23Q 35/02 408/1 R 4,975,142 A 12/1990 Iannacone et al.

(Continued)

FOREIGN PATENT DOCUMENTS

CN 1935430 A 3/2007

CN 104663008 A 5/2015

(Continued)

OTHER PUBLICATIONS

European Patent Application No. 20884799.6—European Search Report dated Dec. 19, 2023, 12 pages.

(Continued)

*Primary Examiner* — Livius R. Cazan

(74) *Attorney, Agent, or Firm* — Polsinelli PC

(57) ABSTRACT

The disclosure provides a multilayer structure for a printed wiring board (PWB). The multilayer structure may include a plurality of insulating layers interleaved with a plurality of conductive layers comprising at least one inner conductive layer. The multilayer structure may also include one or more stub-less plated through-holes through the plurality of insulating layers and the plurality of conductive layers. The multilayer structure may include at least one secondary material layer formed on the at least one inner conductive layer. The secondary material layer defines a void that creates a discontinuity in the plated through-hole to achieve segmented metallization of the plated through-hole. The disclosure also provides a method of forming the multilayer structure.

20 Claims, 22 Drawing Sheets

Related U.S. Application Data

(60) Provisional application No. 62/931,690, filed on Nov. 6, 2019.

(56) References Cited

U.S. PATENT DOCUMENTS

| | | | | |
|---|---|---|---|---|
| 5,022,801 | A | 6/1991 | Anthony et al. | |
| 6,196,908 | B1 | 3/2001 | Adams | |
| 2004/0084321 | A1 | 5/2004 | Thorn et al. | |
| 2005/0032254 | A1 | 2/2005 | Cheng et al. | |
| 2005/0129349 | A1 | 6/2005 | Tourne | |
| 2006/0127652 | A1 | 6/2006 | Kanaya et al. | |
| 2006/0255009 | A1* | 11/2006 | Card | H05K 3/427 216/13 |
| 2007/0246252 | A1* | 10/2007 | Buchwalter | H05K 3/429 29/830 |
| 2008/0296057 | A1 | 12/2008 | Dudnikov, Jr. | |
| 2009/0257839 | A1 | 10/2009 | Lin | |
| 2014/0001150 | A1 | 1/2014 | Lecesse | |
| 2014/0017901 | A1 | 1/2014 | O'Hara | |
| 2015/0208514 | A1 | 7/2015 | Thomas et al. | |
| 2015/0351240 | A1 | 12/2015 | Nabeyama | |
| 2016/0021762 | A1* | 1/2016 | Kallman | C25D 5/02 29/745 |
| 2016/0278206 | A1 | 9/2016 | Bahl et al. | |
| 2016/0278208 | A1* | 9/2016 | Pen | H05K 3/4623 |
| 2016/0338191 | A1 | 11/2016 | Tanaka et al. | |
| 2019/0141840 | A1* | 5/2019 | Thompson | H05K 3/429 |
| 2019/0182968 | A1 | 6/2019 | Kuczynski et al. | |
| 2021/0136928 | A1 | 5/2021 | Lehrer et al. | |
| 2022/0053641 | A1 | 2/2022 | Neely et al. | |
| 2022/0338348 | A1 | 10/2022 | Gao et al. | |
| 2023/0119480 | A1* | 4/2023 | Zhou | H01L 21/4857 174/258 |

FOREIGN PATENT DOCUMENTS

| | | | |
|---|---|---|---|
| CN | 105491792 | A | 4/2016 |
| CN | 106134301 | A | 11/2016 |
| CN | 108465849 | A | 8/2018 |
| CN | 109640528 | A | 4/2019 |
| CN | 109831878 | A | 5/2019 |
| CN | 110253039 | A | 9/2019 |
| CN | 110278660 | A | 9/2019 |
| JP | H05337895 | A | 12/1993 |
| JP | 2005116945 | A | 4/2005 |
| KR | 20100049842 | A | 5/2010 |
| WO | 2011020859 | A1 | 2/2011 |

OTHER PUBLICATIONS

Search Report for International Patent Application No. PCT/US2025/015643, May 15, 2025, 3 pages.

Decision on Rejection for China Patent Application No. 202080077277.8, Jan. 14, 2026, 14 pages.

First Office Action for Chinese Patent Application No. 202080077277.8, Dec. 20, 2024, 11 pages.

Search Report and Written Opinion for European Patent Application No. 20884799.6, Apr. 20, 2024, 20 pages.

* cited by examiner 1100
1104
1112
1110
1118
1108
1116
1114
1108A
1108B
1101
1102B
1106
1102A
1102C

SYSTEMS AND METHODS FOR REMOVING UNDESIRED METAL WITHIN VIAS FROM PRINTED CIRCUIT BOARDS

CROSS-REFERENCE TO RELATED PATENT APPLICATIONS

This patent application is a continuation-in-part of U.S. patent application Ser. No. 17/092,080, entitled "SYSTEMS AND METHODS FOR REMOVING UNDESIRED METAL WITHIN VIAS FROM PRINTED CIRCUIT BOARDS," filed on Nov. 6, 2020, which claims the benefit under 35 U.S.C. § 119(e) of U.S. Provisional Patent Application No. 62/931,690, entitled "SYSTEMS AND METHODS FOR REMOVING UNDESIRED METAL WITHIN VIAS FROM PRINTED CIRCUIT BOARDS," filed on Nov. 6, 2019, each of the foregoing applications is incorporated herein by reference in its entirety.

FIELD

The disclosure is directed to systems and methods for removing stubs from printed circuit boards (PCBs) and for forming stub-less plated through-holes or other voids in PCBs.

BACKGROUND

Consumers are increasingly driving the electronic industry to design and produce smaller and faster electronic devices. During fabrication, portions of circuit traces may be removed, while leaving behind small conductive stubs. Thus, as electronic devices continue to decrease in size, the frequency of signals transmitted through or within the devices also increases. These stubs may radiate noises under high frequency applications. There remains a need for removing the stubs in the vias of the PCB.

BRIEF SUMMARY

In an aspect, a multilayer structure is provided for a printed wiring board (PWB). The multilayer structure may include a plurality of insulating layers interleaved with a plurality of conductive layers, including at least one inner conductive layer, a top conductive layer, and a bottom conductive layer. The multilayer structure may also include one or more stub-less plated through-holes through the plurality of insulating layers and the plurality of conductive layers, and at least one secondary material layer formed on the at least one inner conductive layer. The secondary material layer may include a void that creates a discontinuity in the plated through-hole to achieve segmented metallization of the plated through-hole.

In another aspect, a method may include forming a multilayer structure including a plurality of conductive layers interleaved with a plurality of insulating layers, and at least one secondary material layer disposed over at least one of the plurality of conductive layers inside the multilayer structure; drilling a through-hole through the multilayer structure; selectively depositing a seed layer over a sidewall of the through-hole, wherein the seed layer does not cover an inner side of the secondary material layer; selectively etching the inner side of the secondary material layer to create a void within the through-hole; creating a spot face on a top of the multilayer structure; electroplating a first conductive layer into the through-hole over the seed layer; and electroplating a second conductive layer over the plated first conductive layer in the through-hole to form a plated through-hole in the multilayer structure. In some aspects, the plated through-hole may be a partially plated through-hole.

Additional aspects and features are set forth in part in the description that follows, and in part will become apparent to those skilled in the art upon examination of the specification, or may be learned by the practice of the aspects discussed herein. A further understanding of the nature and advantages of certain aspects may be realized by reference to the remaining portions of the specification and the drawings, which form a part of this disclosure.

BRIEF DESCRIPTION OF THE DRAWINGS

The description will be more fully understood with reference to the following figures and data graphs, which are presented as various aspects of the disclosure and should not be construed as a complete recitation of the scope of the disclosure.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

Printed circuit boards (PCBs) are the structural foundation of most electronic devices. PCBs are used to mount various electronic components of an electronic device and to enable electrical interconnectivity and/or isolation between the electronic components. PCBs are frequently formed by laminating a plurality of conducting layers with one or more non-conducting layers that are interconnected by a plated vertical interconnect access (via). The plated via or plated through-hole in the PCB enables the transmission of electrical signals between the different layers. The plated vias or through-holes may also be used for component insertion.

The PCB may be assembled from a plurality of PCB subassemblies. Each subassembly includes a number of layers including metal traces and dielectric layers or insulators. The PCB assembly may include multiple layers. The PCB can support various electronic components and includes electronic circuits for controlling the electronic components. The PCB includes vias or through-holes to provide electrical connections between layers in the electronic circuits of the PCB that go through the plane of one or more adjacent layers. For example, the following co-owned patents are directed to assembling subassemblies to form a PCB: U.S. Patent Application Publication No. 2014/0047709, entitled "Systems and Methods of Manufacturing Printed Circuit Boards Using Blind and Internal Micro Vias to Complete Subassemblies," filed on Oct. 28, 2013; and U.S. Patent Application Publication No. 2010/0038125, entitled "Additional Functionality Single Lamination Stacked Via with Plated Through Holes For Multilayer Printed Circuit Boards," filed on Aug. 11, 2009. Each of the foregoing references is incorporated by reference in its entirety. The through-holes may include stubs, such as disclosed in U.S. Pat. No. 9,526,184, entitled "Circuit Board Multi-Functional Hole System and Method," which is also incorporated by reference in its entirety.

When the PCB subassemblies are integrated together to form the PCB including multiple layers, stubs may be formed as protruded portions near the end of internal traces in vias or through-holes. The stubs are formed of the same metal as the metal traces. The stubs may be equivalent to antenna to generate noises under high frequency applications, such as at one or more radio frequency (RF) from 100 MHz to 70 GHz. To reduce the noises under high frequency applications, it is desirable to remove the stubs and form vias without stubs or stub-less vias in a PCB when the PCB subassemblies are integrated or assembled together to form the PCB.

Figure 1A:
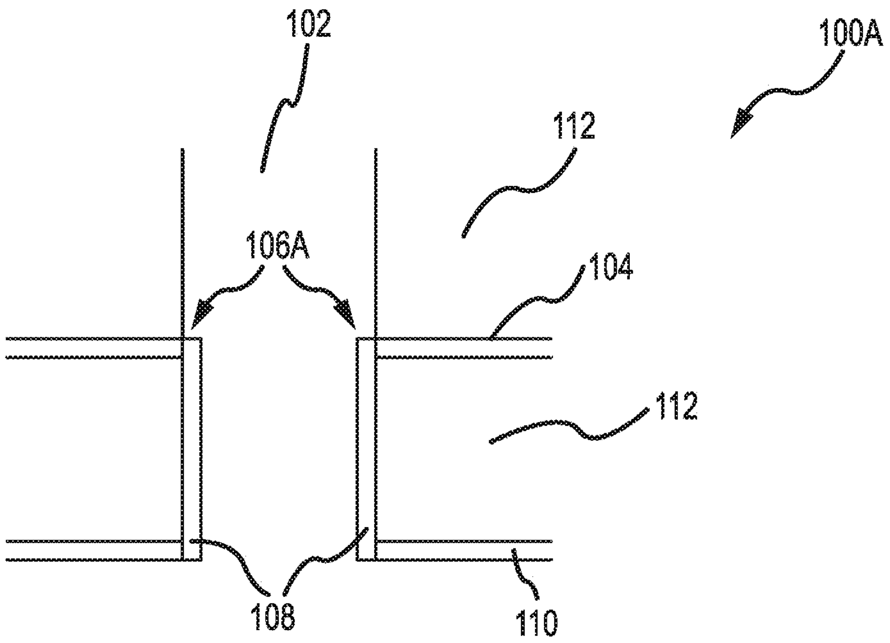
FIG. 1A depicts a conventional via with stubs near corner connections between internal traces and plated conductive layer inside the via in accordance with a first aspect of the disclosure.

FIG. 1A depicts a conventional via with stubs near corner connections between internal traces and plated conductive layer inside a via in accordance with a first aspect of the disclosure. A PCB may include multiple layers of conductive paths or metal traces and insulators or dielectric material. As shown in FIG. 1A, a PCB 100A may include one or more conducting layers 104 and 110 that are separated by one or more dielectric layers 112. As an example, an internal conducting layer or a metal trace 104 is supported by a layer of insulator or dielectric material 112. A bottom conducting layer or a metal trace 110 is below the dielectric material or insulator 112. The PCB 100A may also include a layer of conductive material 108 deposited on an inner wall of via 102 to connect the bottom metal trace 110 to the internal metal trace 104.

In this example, the via 102 has a lower portion of plating 108 below the internal metal trace 104 and plating 108 above internal metal trace 104. The upper portion of the via 102 is not plated with a conductive material, while the lower portion of the via 102 is plated with a conductive material 108.

Figure 1B:
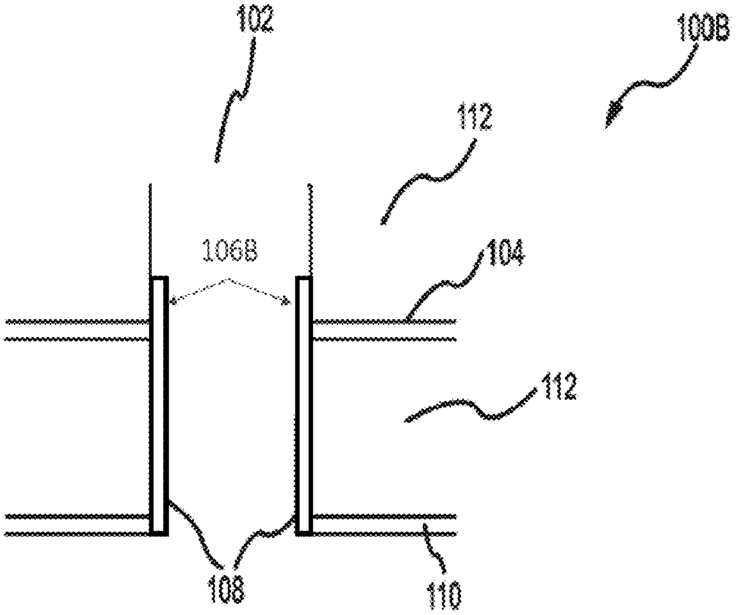
FIG. 1B depicts a conventional via with stubs near the end of internal traces in accordance with a second aspect of the disclosure.

FIG. 1B shows a conventional via with stubs 106B that may be experienced using conventional back drill technology. A PCB 100B may include one or more conducting layers 104 and 110 that are separated by one or more dielectric layers 112. As an example, an internal conducting layer or a metal trace 104 is supported by a layer of insulator or dielectric material 112. A bottom conducting layer or a metal trace 110 is below the dielectric material or an insulator 112. The PCB 100B may also include a layer of conductive material 108 deposited on an inner wall of via 102 to connect the bottom metal trace 110 to the internal metal trace 104.

As shown, stubs 106B are remaining portions of conductive plating 108 that extend above internal metal trace 104 inside via 102 upon the incomplete removal of the plating 108. In this example, the via 102 has a lower portion below the internal metal trace 104, and an upper stub portion above the internal metal trace 104. Both the upper portion of the via 102 and the lower portion of the via 102 are plated with a conductive material 108. The stubs 106B are undesirable because the stubs may generate noises for high RF applications.

The disclosure provides systems and methods for removing stubs from vias of a PCB. In some aspects, the stubs in the vias of the PCB may be removed by drilling a through-hole to remove the unwanted materials in the vias, followed by back drilling and electroplating. The back drilling uses a drilling tool having a slightly larger diameter than the drilling tool used to create the original via hole. In some aspects, stubs for component vias may be removed by back drilling. The drilling or back drilling can help remove stubs and reduce noises radiated from the stubs.

The disclosure also provides a drilling tool for back drilling. The drilling tool is designed to drill until the drilling tool touches an internal trace of the PCB and then can accurately stop at the internal trace of the PCB. The drilling tool can drill through a non-conductive carbon-based material.

Figure 2A:
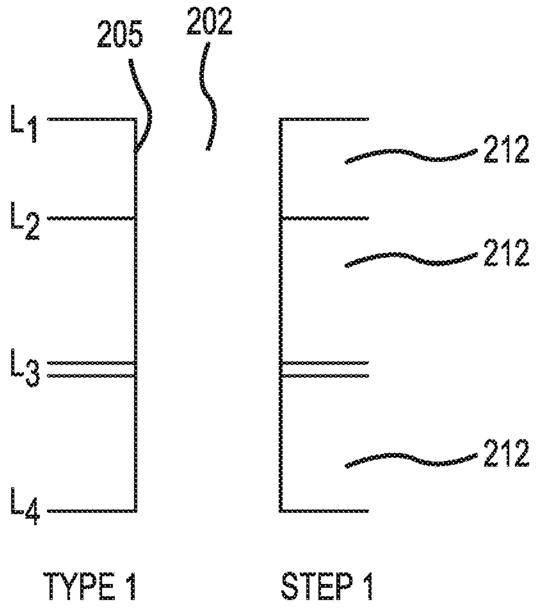
FIGS. 2A-D depict a method of forming a single-side blind via without stubs or stub-less in a multilayer printed circuit board (PCB) in accordance with a first aspect of the disclosure.
Figure 2B:
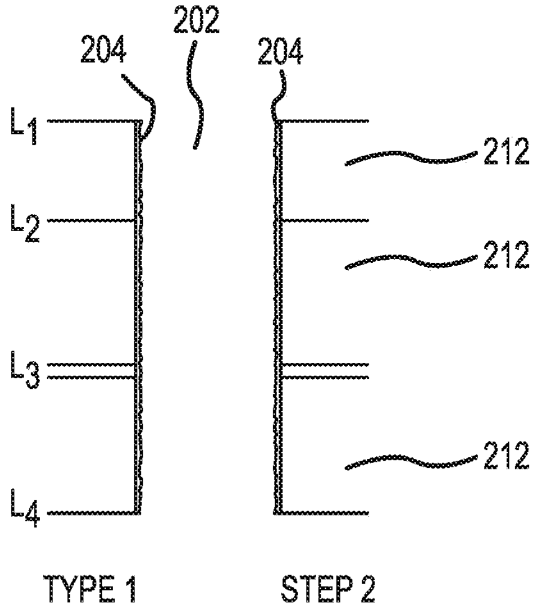
Figure 2C:
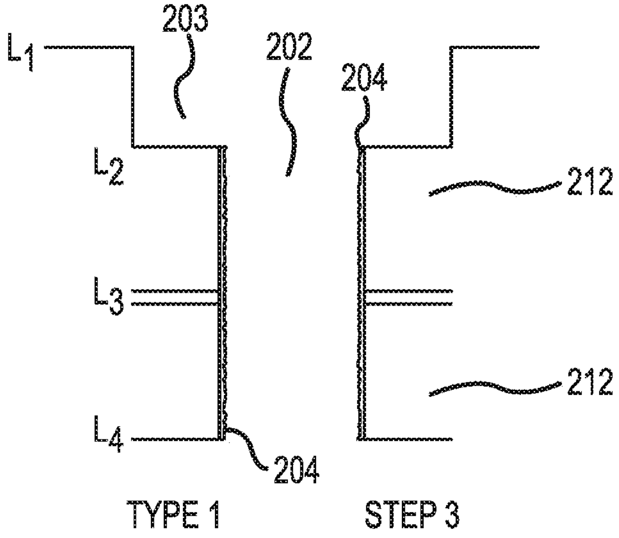
Figure 2D:
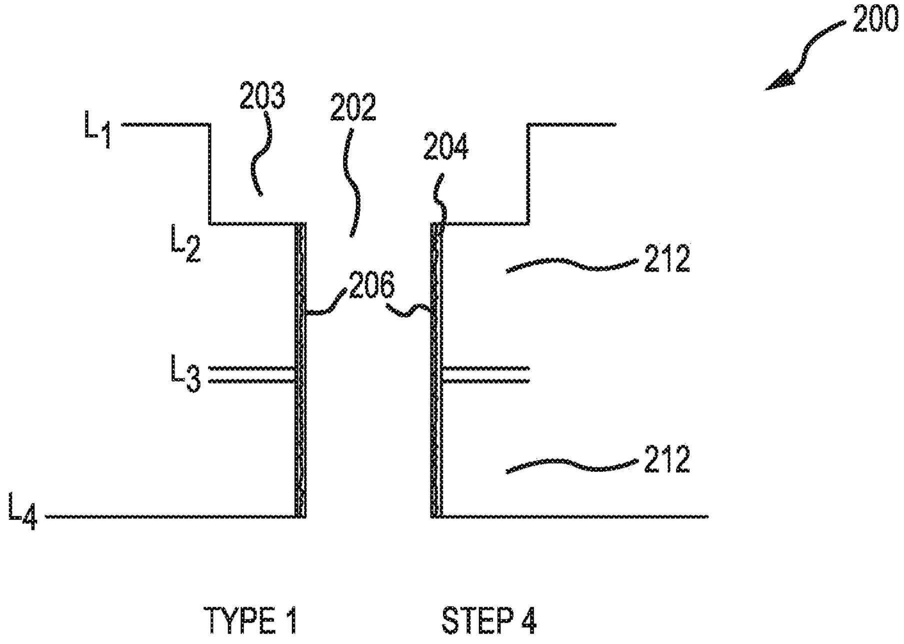

FIGS. 2A-D depict a method of forming a single-side blind via without stubs or stub-less in a multilayer printed circuit board (PCB) in accordance with a first aspect of the disclosure. As shown in FIG. 2D, a multilayer PCB 200 includes multiple layers of conductive paths or metal traces L1-L4 that are separated by one or more dielectric layers 212. The inner wall 205 of the through-hole 202 is plated with a non-conductive carbon-based material 204 and then a conductive material 206, such as copper, is plated over the non-conductive carbon-based material 204.

The method for modifying a via of the multilayer PCB 200 includes: (1) drilling a via in the PCB to form a through-hole 202 by removing material, as shown in FIG. 2A; (2) depositing a non-conductive carbon-based material inside the through-hole, as shown in FIG. 2B; (3) back drilling a portion of the through-hole to form a single-side blind via, as shown in FIG. 2C; and (4) plating a conductive material over the non-conductive carbon-based material, as shown in FIG. 2D.

Referring to FIG. 2A, the first step is to drill a via of the PCB to form a through-hole 202 through the multilayer PCB including metal traces L1-L4 between dielectric layers 212. The multilayer PCB also includes top metal trace L1 and bottom metal trace L4. The through-hole has the same diameter as the via of the PCB. Referring to FIG. 2B, the through-hole 202 is then plated with the non-conductive carbon-based material 204.

As shown in FIG. 2C, an upper portion of the through-hole 202 is modified by back drilling the through-hole to a desired depth. A single-side blind via 203 is formed by back drilling the upper portion of the through-hole 202 to L2 with a drilling tool of a larger diameter than the through-hole 202. In the single-side blind via 203, the non-conductive carbon-based material is removed. The single-side blind via 203 is aligned with and substantially concentric with the through-hole 202.

Back drilling typically involves, for example, using a drilling tool that is slightly larger in diameter than the diameter of the drilling tool used to drill the original hole 206. The depth of the upper portion 212 of the hole 206 depends on the product and/or purpose for which the PCB is being designed. The back drilling forms a single-side blind via 203. As shown, the single-side blind via 203 is above the through-hole 202 and has a larger diameter than the through-hole 202. The back drilling can be accurately performed by using the disclosed drilling tool as described later and illustrated in FIGS. 7A-E below. During the back drilling, the metal trace L2 is grounded such that the metal trace L2 can be detected by the drilling tool when the drilling tool hits the metal trace L2.

Lastly, as shown in FIG. 2D, the conductive material 206 (e.g. copper) is selectively flash plated only on the non-conductive carbon-based material 204. The carbon-based material acts as seed or seeding layer for plating the conductive material 206. As such, the conductive material 206 does not extend vertically beyond L2 into the back drilled via portion 203 to act as an unwanted noise generating stub.

Figure 3A:
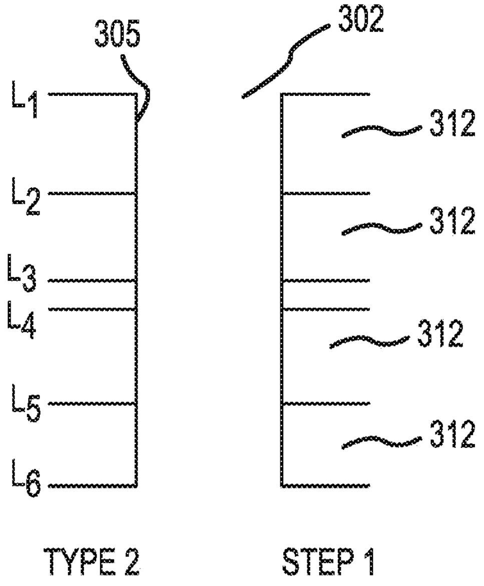
FIGS. 3A-D depict a method of forming a double-side blind via without stubs or stub-less in a multilayer PCB in accordance with a second aspect of the disclosure.
Figure 3B:
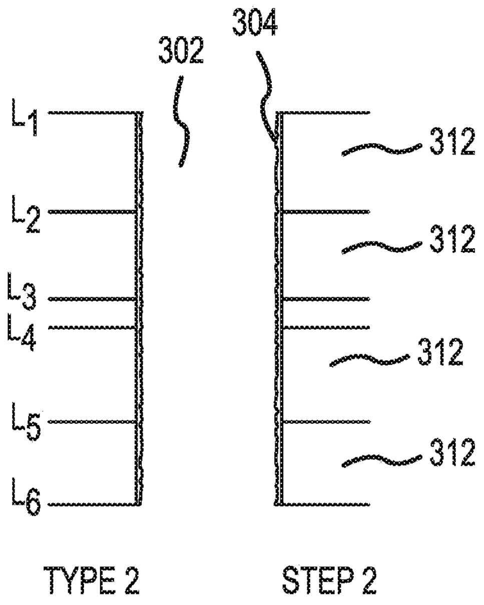
Figure 3C:
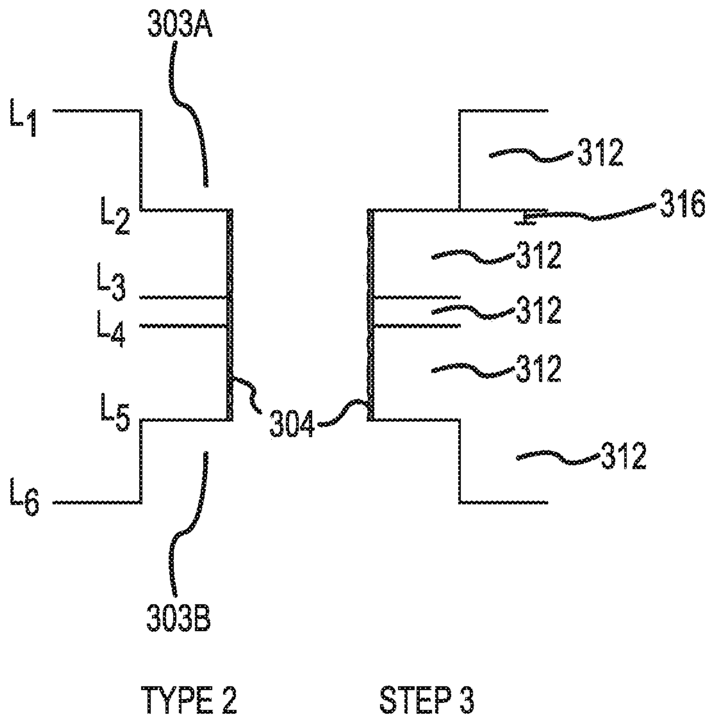
Figure 3D:
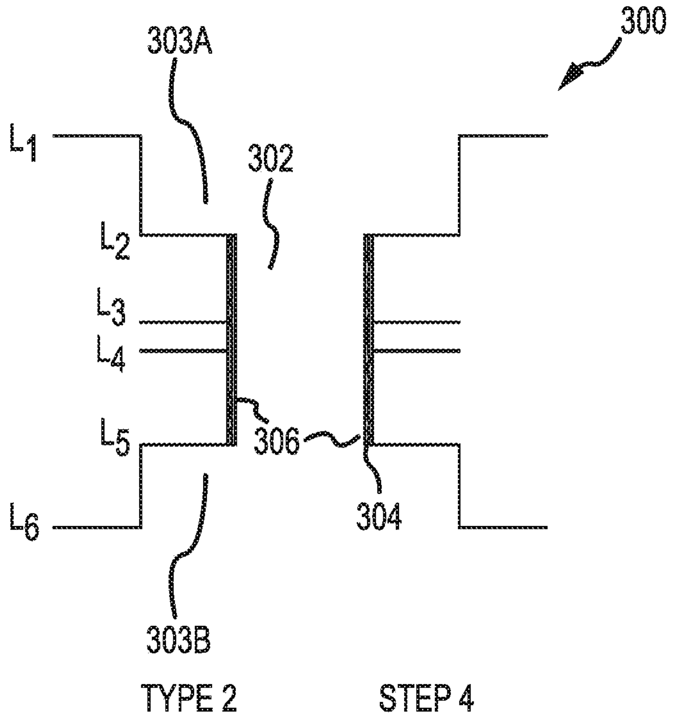

Similar to the method of removing unwanted material from a single-side via, FIGS. 3A-D depict a method of forming a double-side blind via without stubs or stub-less in a multilayer PCB in accordance with a second aspect of the disclosure. As shown in FIG. 3D, a multilayer PCB 300 includes multiple layers of conductive paths or metal traces L1-L6 that are separated by one or more dielectric layers 312. It will be appreciated by those skilled in the art that the number of conducting layers and the number of dielectric layers may vary. The inner wall 305 of the through-hole 302 is deposited with a non-conductive carbon-based material 304 and then plated with a conductive material 306, such as copper, over the non-conductive carbon-based material 304.

The method for forming the multilayer PCB 300 includes: (1) drilling a via of the PCB to form a through-hole to remove unwanted material in the via, as shown in FIG. 3A; (2) depositing a non-conductive carbon-based material inside the through-hole, as shown in FIG. 3B; (3) back drilling the through-hole to form double-side blind vias, as shown in FIG. 3C; and (4) plating a conductive material over the non-conductive carbon-based material, as shown in FIG. 3D.

The multilayer PCB is formed by drilling a via of the PCB to form a through-hole 302 through the multilayer PCB including metal traces L1-L6 separated by dielectric layers 312 to remove unwanted material in the via, as shown in FIG. 3A. The through-hole 302 has the same diameter as the via of the PCB. The PCB 300 includes a top conducting layer or metal trace L1, internal conducting layers or metal traces L2 and L3, and a bottom conducting layer or metal trace L6. The inner wall 305 of the through-hole 302 is then deposited with the non-conductive carbon-based material 304, as shown in FIG. 3B.

An upper portion and a lower portion of the through-hole 302 are further modified by back drilling a portion of the through-hole 302 a specified depth into the PCB. The through-hole 302 is back drilled from opposite sides of the PCB to modify the diameter of the through-hole 302 to form double-side blind vias. The double-side blind vias 303A-B are formed by back drilling the top portion to L2 and the bottom portion to L5 with a drilling tool of a larger diameter than the through-hole 302, as shown in FIG. 3C. In the double-side blind vias, the non-conductive carbon-based material is removed. One blind via 303A is above the through-hole 302 while another blind via 303B is below the through-hole 302. The blind vias 303A-B have a larger diameter than that of the through-hole 302.

The back drilling can be accurately performed by using the disclosed drilling tool as described later and illustrated in FIGS. 7A-E below. During the back drilling, the metal trace L2 is grounded such that the metal trace L2 can be detected by the drilling tool when the drilling tool hits the metal trace L2. The conductive material 306 (e.g. copper) is selectively deposited or plated only on the non-conductive carbon-based material 304, as shown in FIG. 3D. It will be appreciated by those skilled in the art that the number of conducting layers and the number of dielectric layers may vary for a particular PCB.

Figure 4:
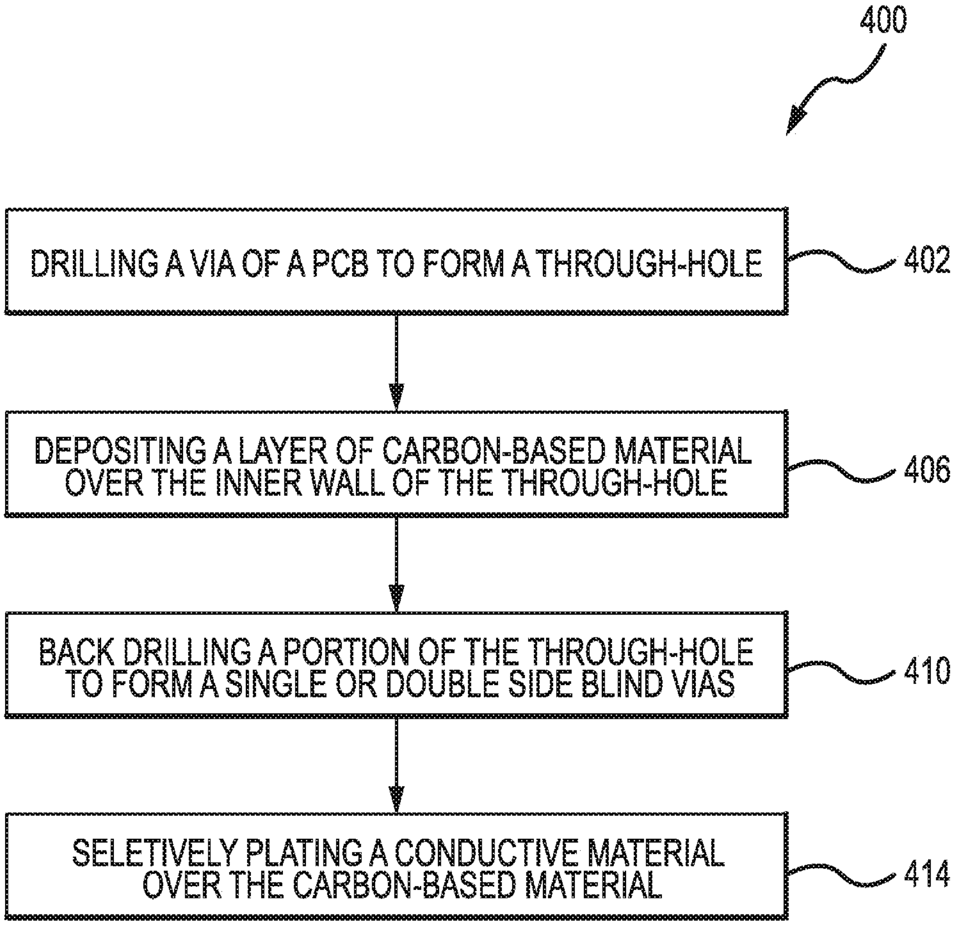
FIG. 4 is a flow chart illustrating the steps of forming the single-side blind via without stubs of FIGS. 2A-D or the double-side blind via without stubs of FIGS. 3A-D in accordance with an aspect of the disclosure.

FIG. 4 is a flow chart illustrating the steps of forming the single-side blind via without stubs of FIGS. 2A-D or the double-side blind via without stubs of FIGS. 3A-D in accordance with an aspect of the disclosure. A method 400 may include drilling a via of a PCB to form a through-hole at operation 402. The method 400 may also include depositing a layer of carbon-based material over the inner wall of the through-hole at operation 406. The carbon-based material is non-conductive. The method 400 may also include back drilling a portion of the through-hole to form a single-side blind via or double-side blind vias at operation 410. The blind via 203 and vias 303A-B are aligned with the respective through-holes 202 and 302. The method 400 may further include plating a conductive material over the carbon-based material at operation 414. The plating may be an electroplating. The plating selectively plates the conductive material (e.g. copper) only onto the carbon-based material in the through-hole 202 or 302, such that the conductive material 206 or 306 is not present in the blind vias 203 or 303A-B. The carbon-based material acts as a seed or a seeding layer for the plating.

For example, in some variations, the conductive material over the through-hole may have a thickness varying from 0.0001 inches to 0.002 inches. In other examples, the non-conductive carbon-based material over the through-hole may have a thickness varying from 60 nanometers to 90 nanometers.

FIGS. 5A-F depict a method of forming a component via without stubs or stub-less in a multilayer PCB in accordance with a third aspect of the disclosure. As shown, a multilayer PCB 500 includes multiple layers of conductive paths or metal traces L1-L6 that are separated by dielectric layers 512. The multilayer PCB 500 is configured to place a component in the blind vias 503A-B. The through-hole 502 is plated with a conductive material 504, such as copper, over a non-conductive carbon-based material 506.

Figure 5A:
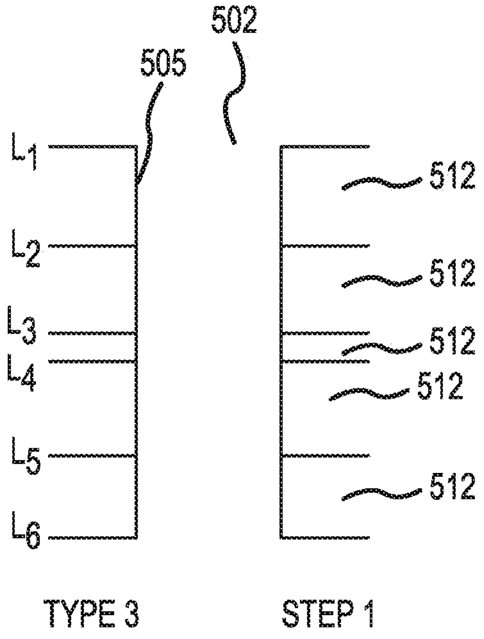
FIGS. 5A-F depict a method of forming a component via without stubs or stub-less in a multilayer PCB in accordance with a third aspect of the disclosure.
Figure 5B:
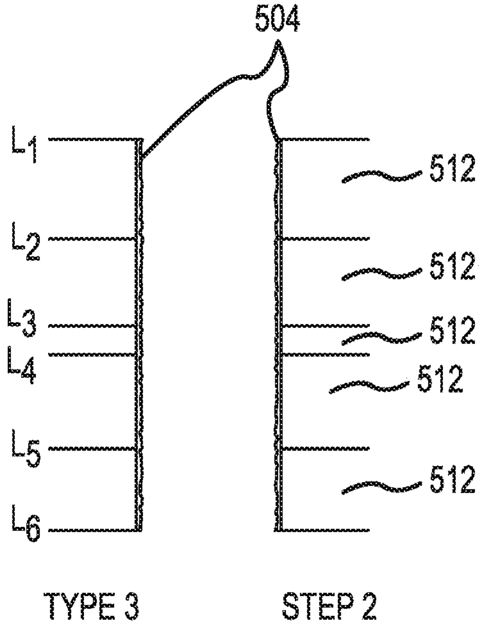
Figure 5C:
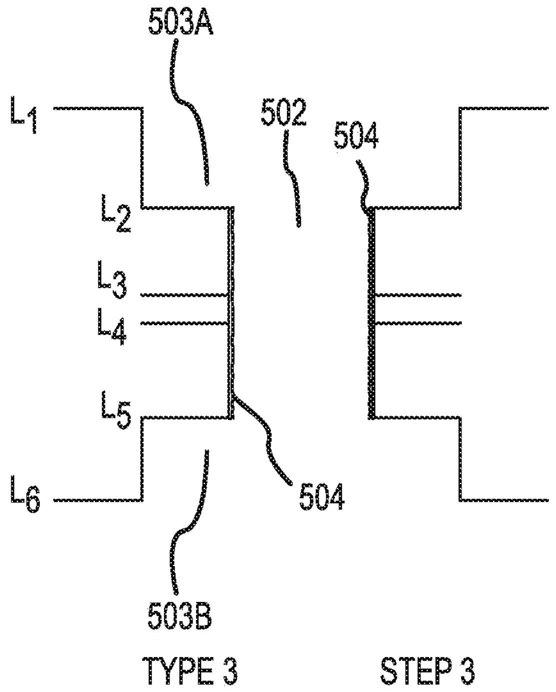
Figure 5D:
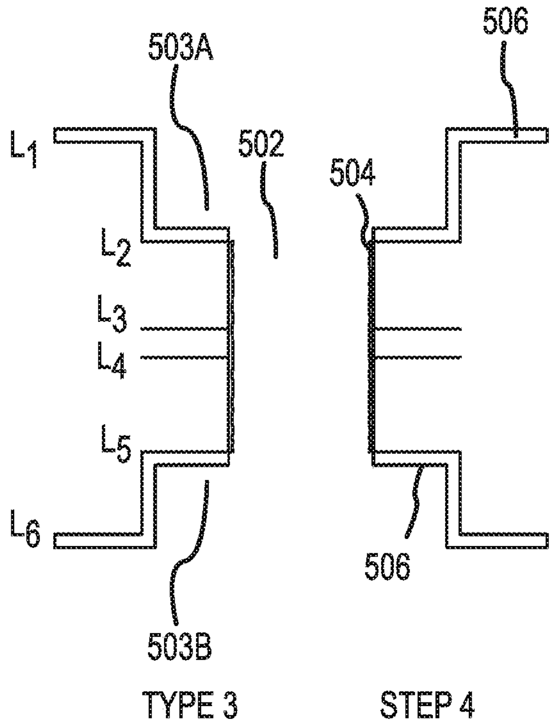

The method for modifying a via of the multilayer PCB 500 includes: (1) drilling a via of a PCB to form a through-hole 502, as shown in FIG. 5A; (2) plating a first conductive material inside the through-hole, as shown in FIG. 5B; (3) back drilling a portion of the through-hole to form double-side blind vias, as shown in FIG. 5C; (4) depositing a non-conductive carbon-based material over the double-side blind vias, as shown in FIG. 5D; (5) vapor etching to remove the first conductive material from the through-hole; and (6) plating a second conductive material over the non-conductive carbon-based material in the blind vias.

Specifically, the multilayer PCB 500 is formed by drilling a through-hole 502 through the multilayer PCB including conducting layers or metal traces L1-L6 separated by dielectric layers 512, as shown in FIG. 5A. The PCB includes the top conducting layer or metal trace L1, internal conducting layers or metal traces L2-L5, and a bottom conducting layer or metal trace L6. The inner wall 505 of the through-hole 502 is then plated with the first conductive material 504, as shown in FIG. 5B. In one aspect the conductive material 504 is an electroless copper strike.

An upper portion and a lower portion of the through-hole 502 are further modified by back drilling a specified depth into the PCB. The through-hole 502 is back drilled from opposite sides of the through-hole 502 to modify the diameter to form double-side blind vias 503A-B. The top portion of the through-hole 502 is back drilled to an internal conducting layer or a metal trace L2, and the bottom portion of the through-hole 502 is back drilled to an internal conducting layer or a metal trace L5 with a drilling tool of a larger diameter than the through-hole 502, as shown in FIG. 5C. The double-side blind via 503A is above the through-hole 502 while the blind via 503B is below the through-hole 302. The blind vias 503A-B have a larger diameter than the through-hole 502. The back drilling can be accurately performed by using the disclosed drilling tool as described later and illustrated in FIGS. 7A-E below. During the back drilling, each of the internal metal traces L2 and L5 is grounded, such that the metal trace L2 or L5 can be detected by the drilling tool when the drilling tool hits the metal trace L2.

As shown in FIG. 5D, a non-conductive carbon-based material 506 is deposited over the blind vias 503A-B. The non-conductive carbon-based material 506 does not adhere to the first conductive material 504 inside the through-hole 502. Thus, the carbon-based material 506 is not deposited within the through-hole 502.

Figure 5E:
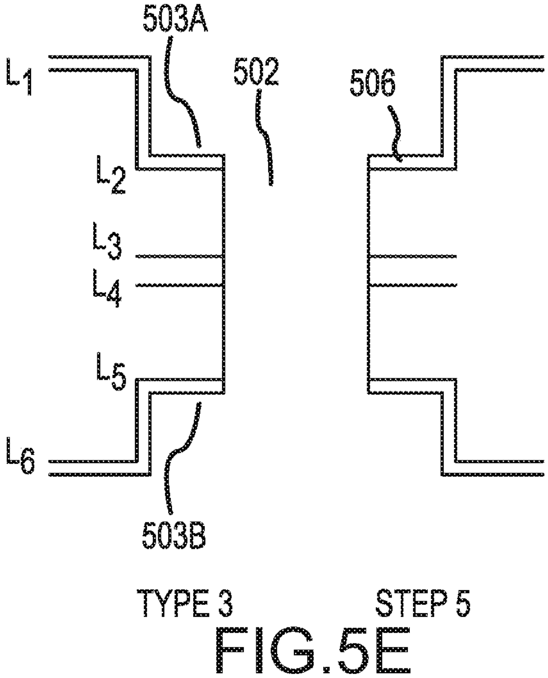

As shown in FIG. 5E, the first conductive material 504 (e.g. plated copper) is removed from the through-hole 502 by vapor etching or micro-etching. Micro-etching is used to selectively remove the first conductive material 504, such as plated copper, but does not remove the non-conductive carbon-based material 506. The productivity and efficiency of the etching method for removing the plated copper is much higher than the mechanical drilling.

Figure 5F:
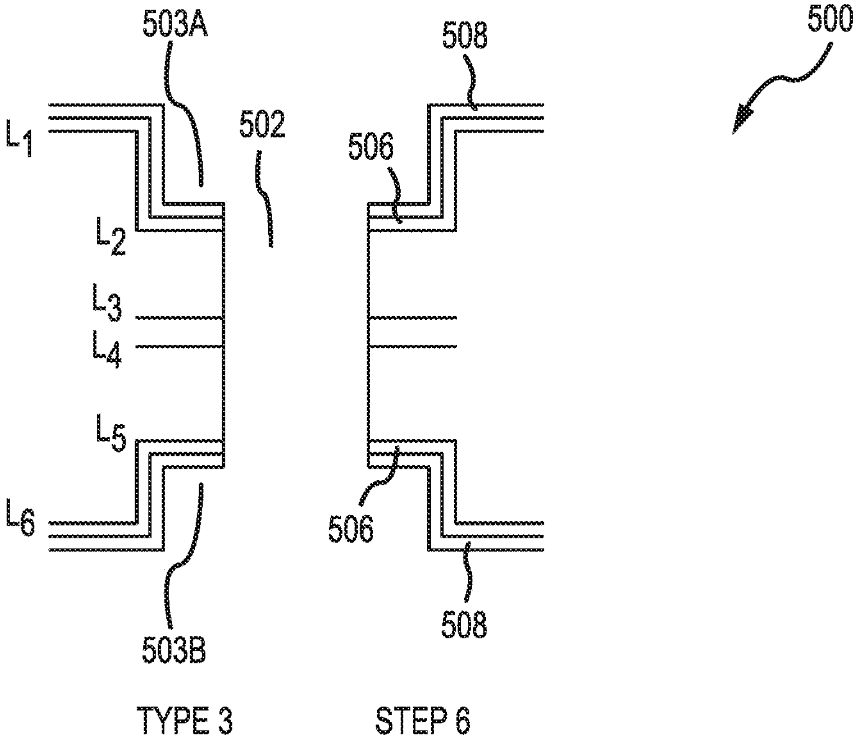

As shown in FIG. 5F, a second conductive layer 508 (e.g. copper) is plated or electroplated onto the non-conductive carbon-based material 506 at the upper and lower blind vias 503A-B. The second conductive material 508 is plated or electroplated only on the non-conductive carbon-based material 506. There is no conductive material on the inner surface in the middle portion of the through-hole 502. As a result, the metal trace L2 in the upper portion is isolated or insulated from the metal trace L5 in the lower portion.

It will be appreciated by those skilled in the art that the number of conducting layers and the number of dielectric layers may vary. It will be appreciated by those skilled in the art that the method may also be used to form single-side blind via for a component.

Figure 6:
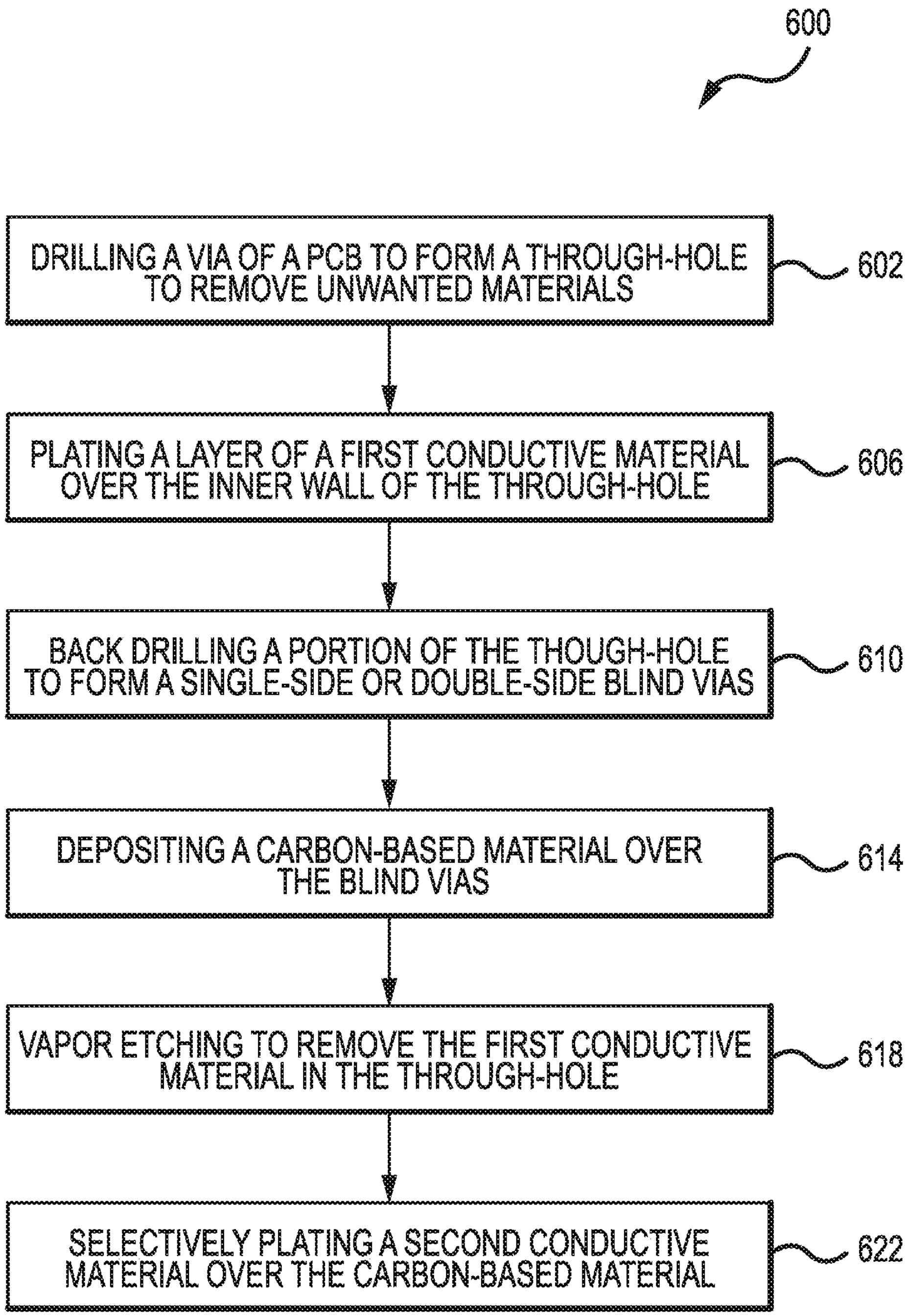
FIG. 6 is a flow chart illustrating the steps of forming the component via without stubs of FIGS. 5A-F in accordance with an aspect of the disclosure.

FIG. 6 is a flow chart illustrating the steps of forming the component via without stubs of FIGS. 5A-F in accordance with an aspect of the disclosure. A method 600 may include drilling a via of a PCB to form a through-hole to remove unwanted materials in the via of the PCB at operation 602. The through-hole may have the same diameter as the via. The method 600 may also include plating a layer of a first conductive material 504 over the inner wall of the through-hole at operation 606. The first conductive material may be electroless copper, among others. The plating may be an electroless copper strike. The method 600 may also include back drilling a portion of the through-hole to form a single-side blind via or a double-side blind vias at operation 610.

The method 600 may further include depositing a carbon-based material 506 over the single or double blind vias at operation 614. The carbon-based material is non-conductive. The carbon-based material is selected not to adhere to the plated first conductive material 504, for example copper, such that the carbon-based material 506 is not present in the plated through-hole 502 with the first conductive material 504.

The method 600 may further include vapor etching to remove the plated first conductive material (e.g. copper) in the middle portion of the through-hole at operation 618. The vapor etching does not remove the non-conductive carbon-based material 506 in the single blind via or double blind vias 503A-B.

The method 600 may further include plating a second conductive material 508 over the carbon-based material at operation 622. The second conductive material 508 may include copper, among others. The plating may be an electroplating, which would only plate the second conductive material onto the non-conductive carbon-based material in the middle portion of the through-hole 502.

The process for plating the first and second conductive materials may be the same, but the first and second conductive materials may have varying thicknesses. In some variations, the first conductive material over the through-hole may have a thickness varying from 0.0001 inches to 0.0004 inches. In some variations, the second conductive material over the blind vias may have a thickness varying from 0.0005 inches to 0.002 inches.

In some variations, the non-conductive carbon-based material over the blind vias may have a thickness varying from 60 to 90 nanometers.

Figure 7A:
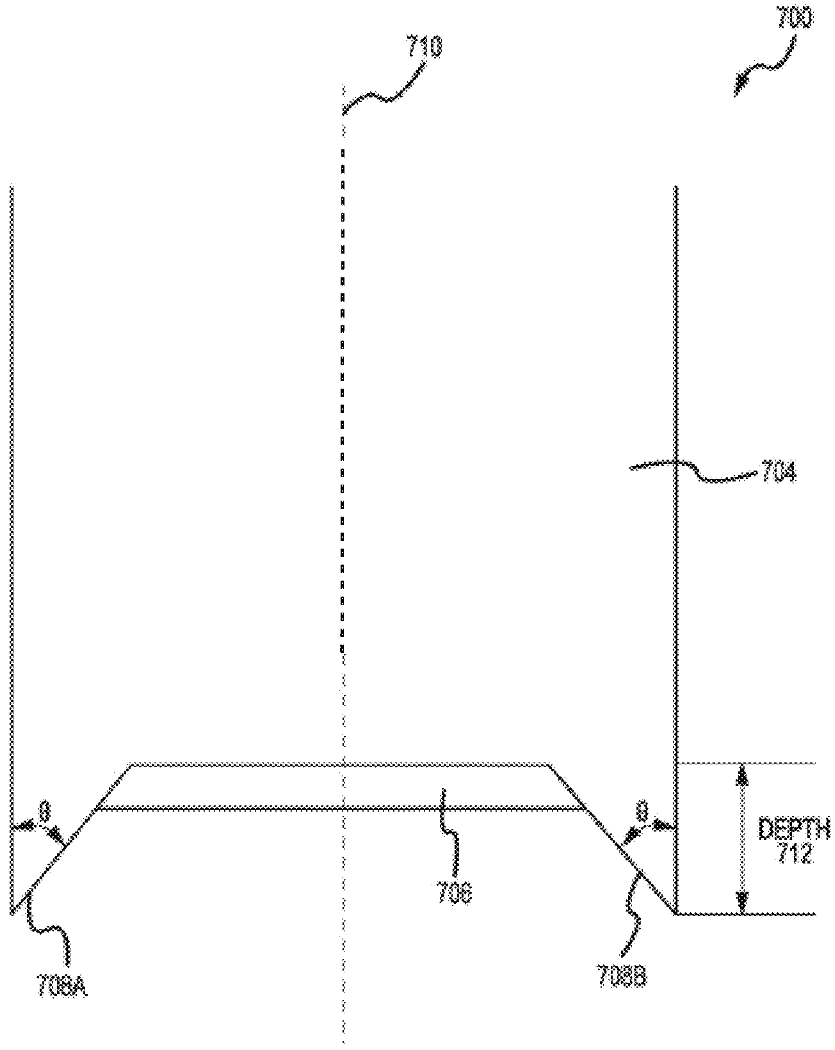
FIG. 7A depicts a side view of the drilling tool in accordance with an aspect of the disclosure.

In some variations, blind vias or through-holes may have a diameter ranging from 0.0295 inches to 0.0595 inches. A conventional drilling tool may not work consistently with the through-hole having a diameter larger than 0.0295 inches. The disclosed drill below can back drill the PCB to form blind vias. FIG. 7D depicts a cross-sectional view of a drilling tool 700 along line A-A in accordance with an aspect of the disclosure. As shown in FIG. 7D, a drilling tool 700 may include an inner core 702 surrounded by an outer coating layer 704. FIG. 7A depicts a side view of the drilling tool in accordance with an aspect of the disclosure.

Various combinations of conductive and non-conductive materials may be used. For example, in some variations, the inner core 702 may include a conductive material or a non-conductive material. In some variations, the outer coating layer 704 may include a non-conductive material or a conductive material. In some variations, the inner core 702 may include a non-conductive material, while the outer coating layer 704 may include a conductive material. In some variations, the inner core 702 may include a conductive material, and the outer coating layer 704 may include a conductive material. In some variations, the inner core 702 may include a non-conductive material, and the outer coating layer 704 may include a non-conductive material. In some variations, the inner core 702 may include a conductive material, while the outer coating layer 704 may include a non-conductive material.

In some aspects, the conductive material of the inner core may include carbide and cobalt, among others. In some aspects, the non-conductive material of the outer coating may include diamonds, among others. The drilling tool 700 may also include two drill tips or drill cutting portions 708A-B near the bottom of the inner core 702. As shown in FIGS. 7A and 7D, the drill cutting portions 708A-B extend downward from the bottom 716 of the core 702.

In some aspects, the drill cutting portions 708A-B may be formed of the conductive material. The two drill cutting portions 708A-B are substantially symmetric to a vertical centerline 710 of the inner core 702. The two drill cutting portions 708A-B may have a triangular shape including an outer edge substantially parallel to the vertical centerline 710. The cutting portions have an angle θ less than 75° from the outer edge. A depth 712 of the drill cutting portions 708A-B is the distance from the bottom surface 712 of the outer coating layer 704 to end points 713A-B of the drill cutting portions. The depth 712 may vary from 0.010 inches to 0.020 inches.

The drilling tool 700 may also include a non-conductive coating 706 over the outer coating layer 704 between the two drill cutting portions 708A-B, as shown in FIG. 7D. The non-conductive coating may include diamonds, among others. The non-conductive coating 706 can provide a robust non-conductive cutting surface. As an example, the diamond coating may have a thickness of approximately 0.010 inches.

The drilling distance into the non-conductive carbon-based material may vary, and is determined by the difference between the depth 712 and the thickness of the non-conductive coating 706.

It will be appreciated by those skilled in the art that the depth of the drill cutting portions and the non-conductive coating thickness may vary for applications, depending upon the thickness of the non-conductive carbon-based material.

Figure 7B:
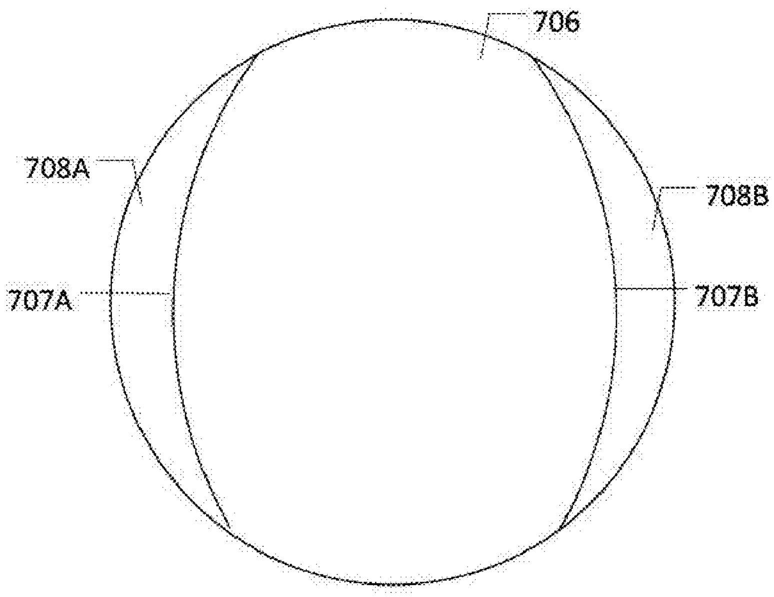
FIG. 7B depicts a bottom view of the drilling tool of FIG. 7A illustrating the drill in accordance with an aspect of the disclosure.

FIG. 7B depicts a bottom view of the drilling tool 700. As shown in FIG. 7B, the drill cutting portions 708A-B are near edges 707A-B of the non-conductive coating 706.

Figure 7C:
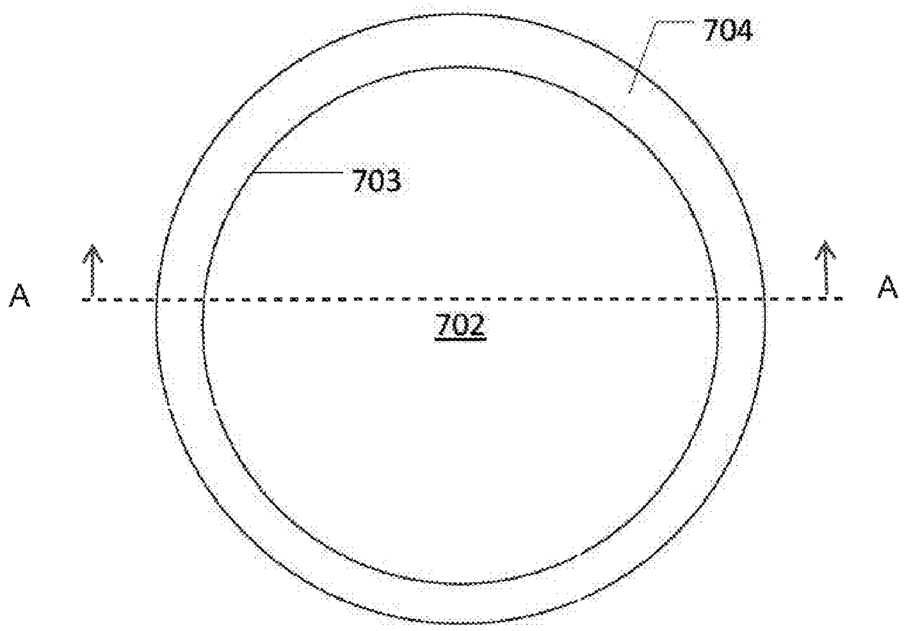
FIG. 7C depicts a top view of the drilling tool of FIG. 7A illustrating the shape of the core and outer coating layer in accordance with an aspect of the disclosure.
Figure 7D:
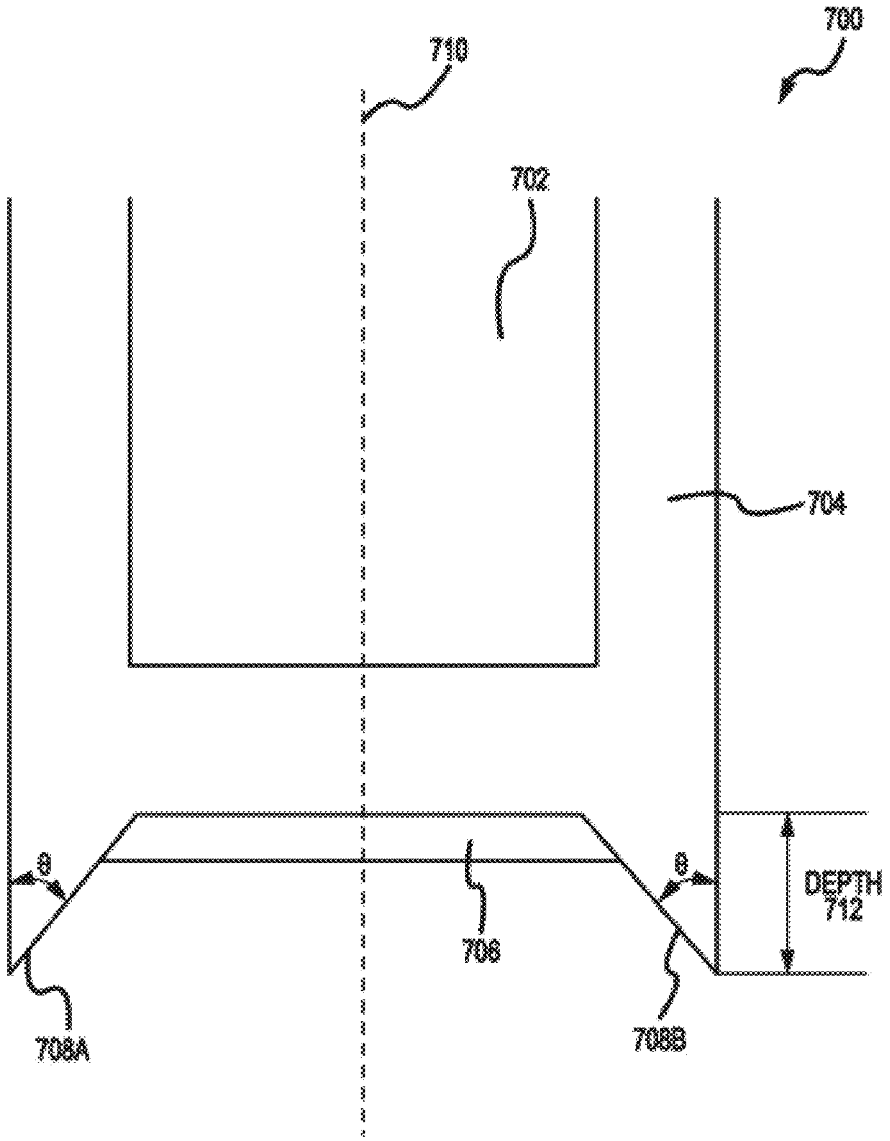
FIG. 7D depicts a cross-sectional view of the drilling tool of FIG. 7A as viewed along line A-A for back drilling in accordance with an aspect of the disclosure.

FIG. 7C depicts a top view of the drilling tool 700. The core 702 can have a cylindrical shape. As shown in FIG. 7C, the core 702 has a cylindrical outer surface 703 from the top view. The outer coating layer 704 is disposed on the cylindrical outer surface 703.

Figure 7E:
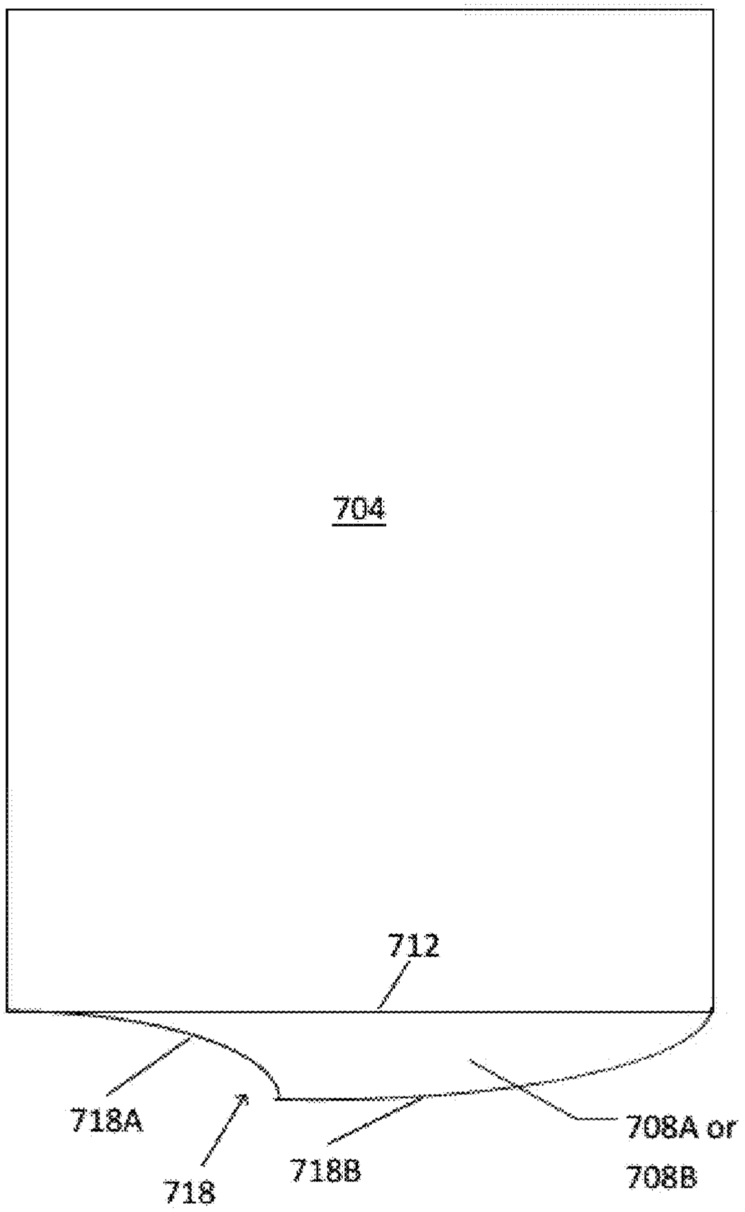
FIG. 7E depicts another side view of the drilling tool illustrating the shape of the drill cutting portion in accordance with an aspect of the disclosure.

FIG. 7E depicts another side view of the drilling tool 700 illustrating the shape of the drill cutting portion in accordance with an aspect of the disclosure. The side view reveals the shape of the drill cutting portion 708A or 708B. In this side view, the drill cutting portions 708A-B overlap. The cutting portion 708A or 708B has a curved edge under the bottom portion 712 of the outer coating 704. The curved edge may include a first portion 718A configured to cut and a second portion 718B. It will be appreciated by those skilled in the art that the shape and size of the first portion 718A and the second portion 718B of the curved edge 708A-B may vary.

The drilling tool 700 can drill through the non-conductive carbon-based material, but stops when the cutting portions of the drilling tool 700 hit a conductive material, such as that in a conductive layer or trace within a PCB. In one aspect, the conductive material grounded during drilling such that the drilling tool can detect the conductive material through the completion of a circuit.

Figure 10:
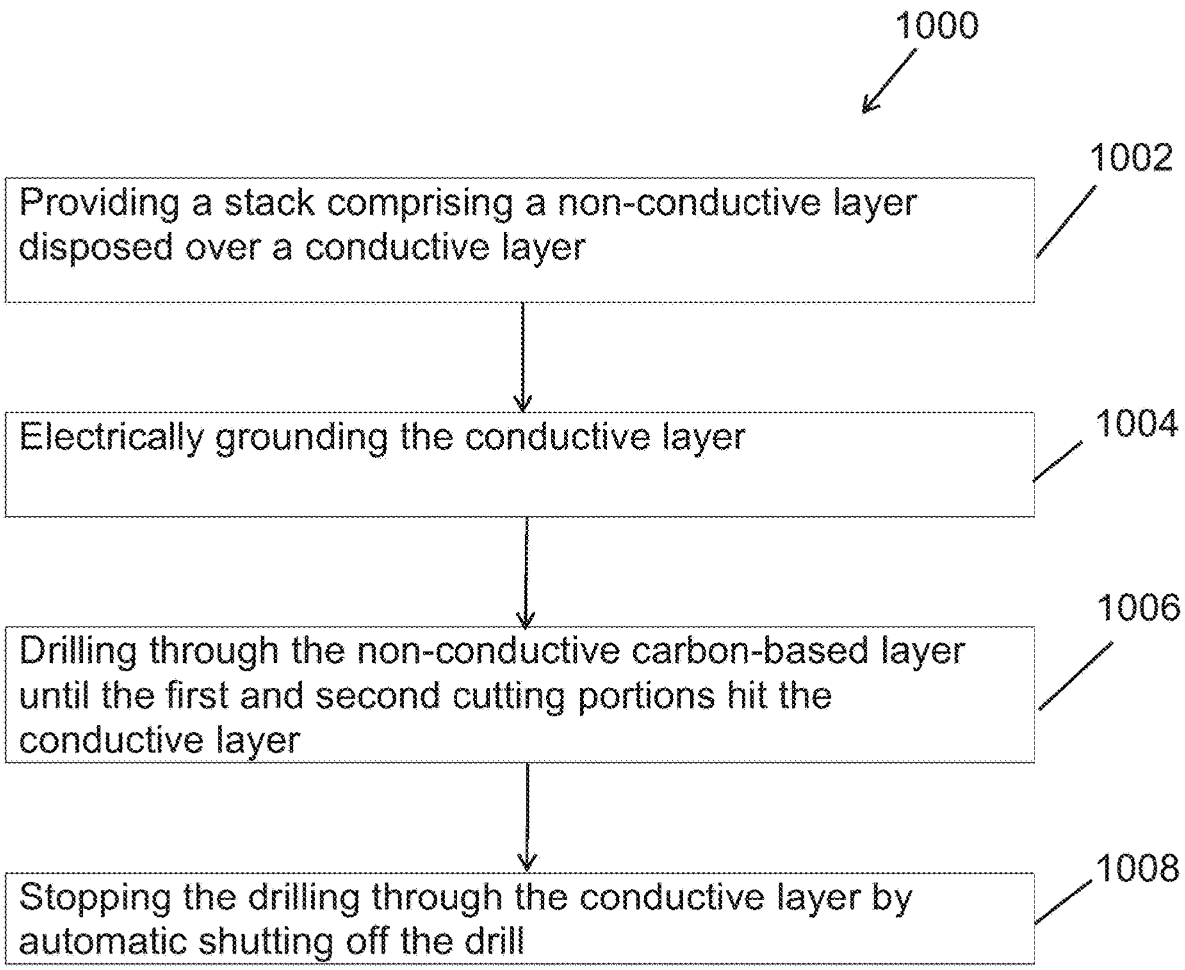
FIG. 10 is a flowchart depicting a method for removing unwanted metal from a via in accordance with an aspect of the disclosure.

In one aspect, a method 1000, illustrated in FIG. 10, for drilling a PCB by using the drill or drilling tool 700 is disclosed. The method may include providing a stack or a PCB comprising a non-conductive layer disposed over one or more conductive layers at step 1002. The conductive layers may be further separated by additional non-conductive layers. For example, the PCB including a plurality of subassemblies comprising a plurality of non-conductive layers and conductive layers.

The method also includes electrically grounding one or more of the conductive layers at step 1004 and drilling through the non-conductive layer until the cutting portion(s) hit a conductive layer at step 1006. Upon contacting the conductive layer, a circuit may be completed or, alternatively, shunted, thus automatically stopping the drill at step 1008. In various aspects, any suitable combination of switches, relays, resistors or other electrical components may be used to automatically stop the drill upon contact with the grounded conductive layer.

The system includes a drilling system including a drilling tool 700 as disclosed herein. The drilling tool can be used for back drilling. This drilling tool is better than the conventional drilling tool, which cannot stop as accurately as the disclosed drilling tool. For example, the conventional drilling tool may stop at a predetermined distance, may be prior to reach the internal trace. The conventional drilling tool may also drill through a portion of the internal trace. An original through-hole can be formed with a conventional drilling tool having a smaller diameter than the drilling tool for back drilling.

The system also includes a deposition system. The deposition system may include one or more deposition machines and/or baths. The deposition system is used, for example, to plate a conductive material, such as copper, over the non-conductive carbon-based material within the through-hole 202 as described above in reference to FIG. 2D.

The deposition system can also be used, for example, to plate the conductive material, such as copper, over the non-conductive carbon-based material within the through-hole 302 as described above in reference to FIG. 3D.

The deposition system can also be used to deposit or plate the first conductive material 504, such as copper, inside a through-hole 502 as described in reference to FIG. 5B, and also deposit or plate the second conductive material 508, such as copper, over the non-conductive carbon-based material 506 as described in reference to FIG. 5F.

The deposition system can further deposit or plate the non-conductive carbon-based material 204 inside the through-hole, as described in reference to FIG. 2C. The deposition system can also deposit the non-conductive carbon-based material 304 inside the through-hole 302, as described in reference to FIG. 3C. The deposition system can also deposit the non-conductive carbon-based material 506 in the blind vias, as described in reference to FIG. 5D. In some aspects, the non-conductive carbon-based material may be graphite. among others.

The system also includes an etchant system. The etchant system can perform vapor etching or micro-etching to remove the first conductive material, such as plated copper (Cu) in the through-hole, in connection with FIG. 5E. However, the etchant system does not remove the non-conductive carbon-based material that is deposited over the blind vias 503A-B as shown in FIG. 5E.

EXAMPLES

Figure 8:
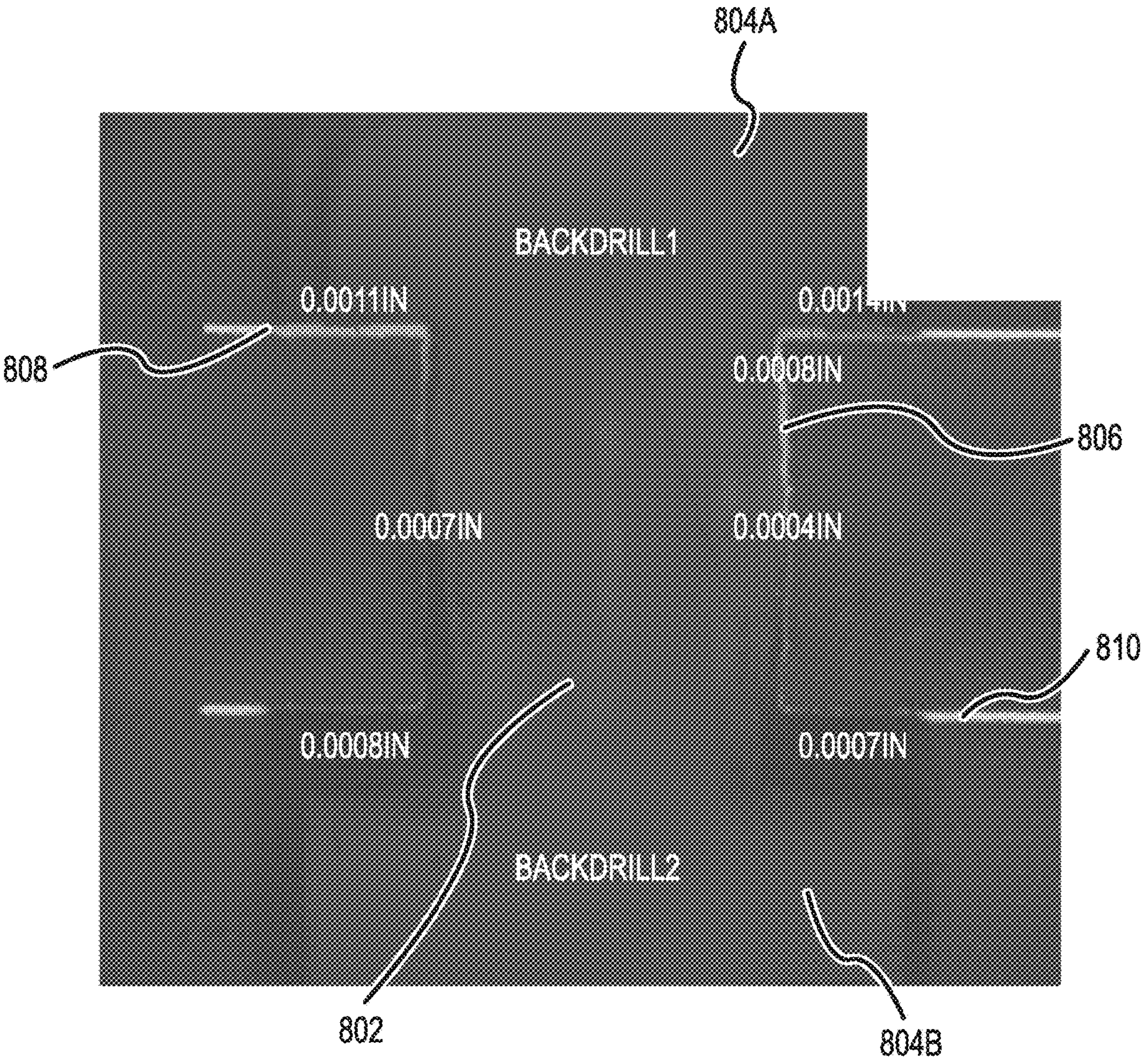
FIG. 8 is an optical photo of a cross-section of a PCB including double-side back drills and a plated through-hole without stubs or stub-less in accordance with an aspect of the disclosure.

Experiments were performed to form stub-less vias in PCBs by using the disclosed systems and methods described above. FIG. 8 is an optical photo of a cross-section of a PCB including double-side back drills and a plated through-hole without stubs or stub-less in accordance with an aspect of the disclosure. As shown, a first back drill 804A was above a through-hole 802, and a second back drill 804B was below the through-hole 802. No stubs were present in the through-hole 802, which was formed by drilling the via of the PCB. The top and bottom blind vias 804A-B had a slightly larger diameter than the through-hole 802. The through-hole 802 was plated with copper 806 (vertical light color layer). The top copper trace 808 (horizontal light color layer) connected to the bottom copper trace 810 (horizontal light color layer) through the plated copper 806 in the through-hole 802. As shown, the plated copper layer had a thickness of 0.0007 inches, 0.0008 inches, and 0.0004 inches at different locations of the inner wall of the through-hole. The bottom copper trace had a thickness of 0.0008 inches and 0.0007 inches at different locations. The top copper trace 808 had a thickness of 0.0011 inches and 0.0014 inches at different locations.

Figure 9:
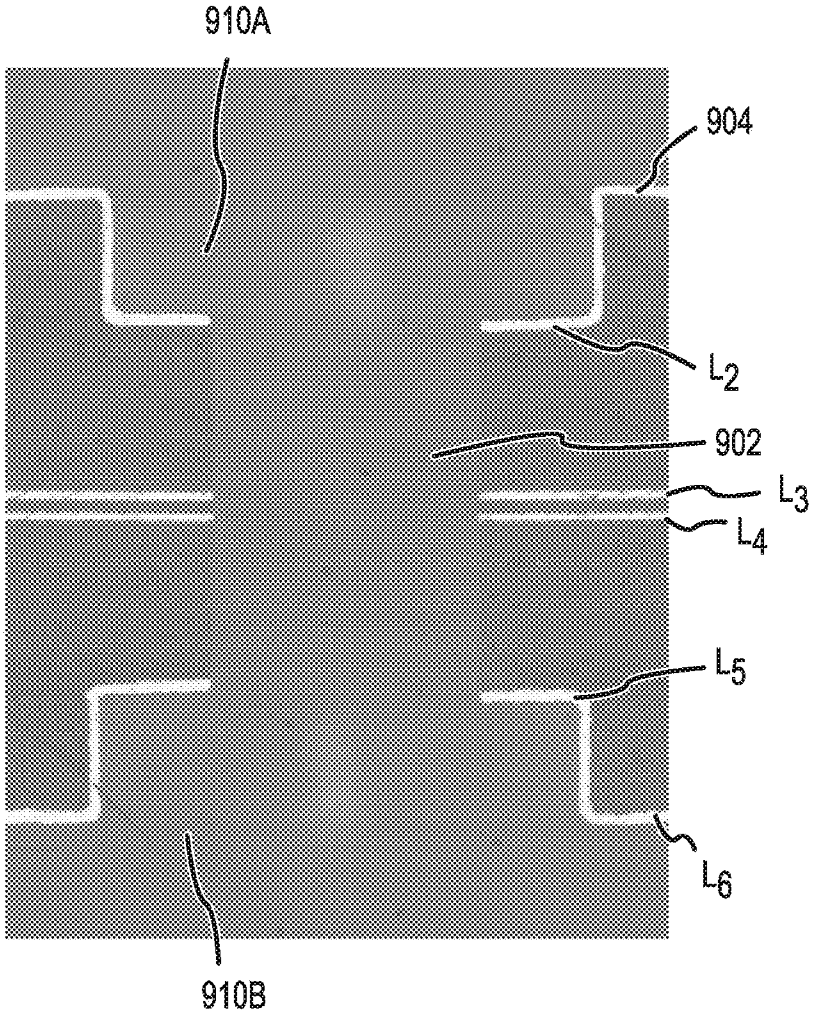
FIG. 9 is an optical photo of a cross-section of a PCB including component vias without stubs or stub-less in accordance with an aspect of the disclosure.

FIG. 9 is an optical photo of a cross-section of a PCB including component vias without stubs or stub-less in accordance with an aspect of the disclosure. This optical photo corresponds to FIG. 5F. As shown, a component can be placed in a blind via 910A or 910B above a through-hole 902. The through-hole 902 was formed by drilling the via of the PCB. The blind via 910A or 910B was formed by back drilling a portion of the through-hole 902 using a drill having a larger diameter than the via or the through-hole 902. The blind via 910A or 910B had a larger diameter than the through-hole 902. There were no stubs at the corner region which was the interface of the blind via 910A or 910B and the through-hole or via 902. The light color layer 904 is the conductive layer.

Creating Void

The disclosure also relates to methods for creating stub-less plated through-holes by creating voids in the stub-less plated through-hole (PTH). The disclosed method involves the use of a secondary material (e.g. other than copper) that is built into the PCB located inside the through-hole. A portion of the secondary material can be removed before metallization to create a void or a discontinuous plating inside the PTH.

The disclosed method creates a stub-less PTH in the PCB without using sub-laminations or paste-interconnect. The disclosed method enables creating PCBs with increased signal integrity performance due to the removal of stubs. The stubs, if not removed from the PTH, may act as an antenna and degrade the integrity performance of the PCB. The disclosed methods can be used for manufacturing high-speed digital and RF-designed PCBs.

The PCB includes components while the PWB does not include components. In the following description, PWB will be used.

Figures 11A, 11B, 11C, 11D, 11E, 11F:
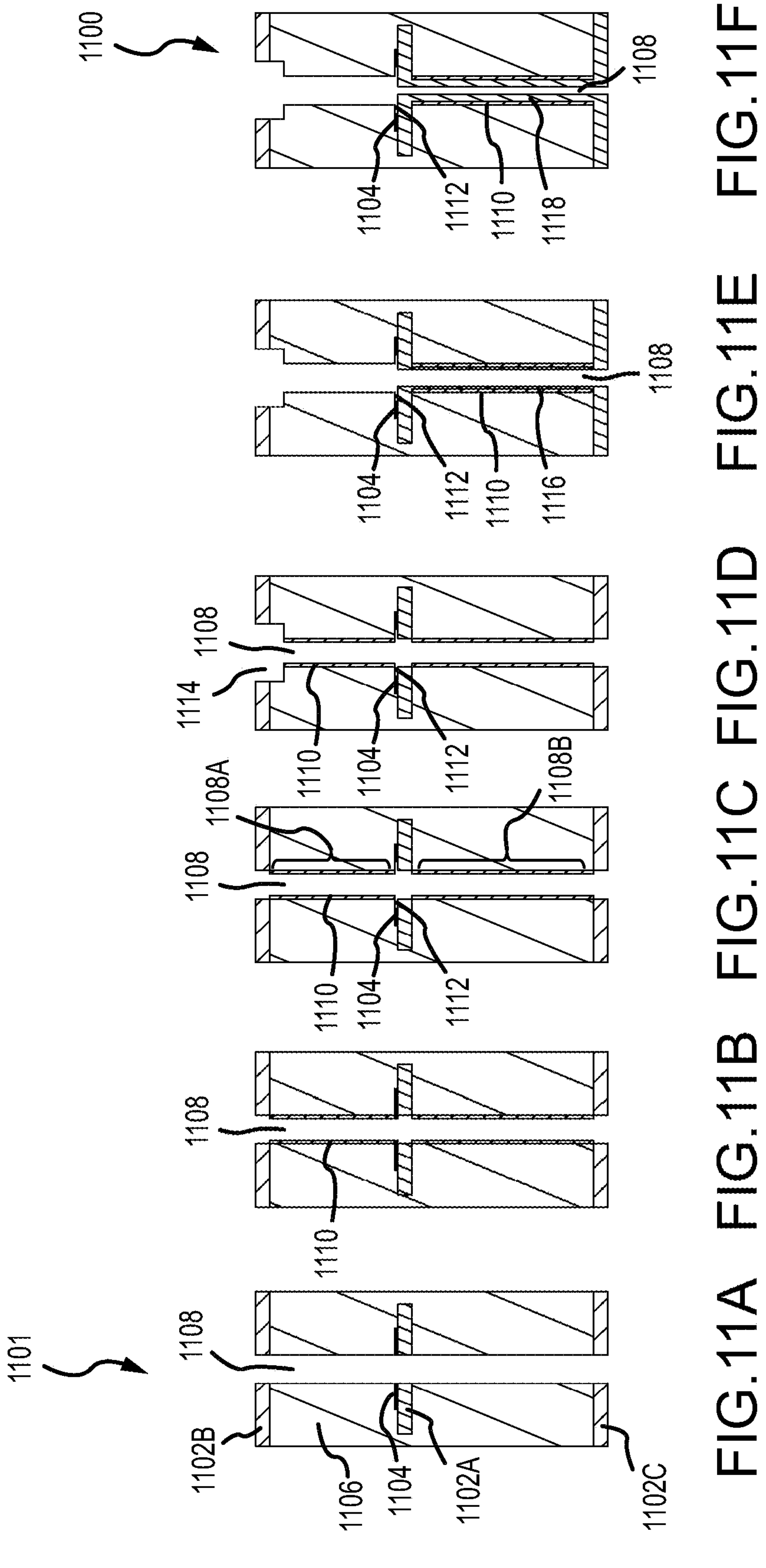
FIGS. 11A-F depict various configurations of a PCB during a method to form a single-side spot face and creating a stub-less plated through-hole and a void in a multilayer printed wiring circuit board (PWB) in accordance with an aspect of the disclosure.

FIGS. 11A-F depict various configurations of a PCB during a method for forming a single-side spot face and creating a stub-less plated through-hole and a void in a multilayer printed wiring circuit board (PWB) in accordance with an aspect of the disclosure. The method includes step 1: laminating and drilling a multilayer structure to form a through-hole, illustrated in FIG. 11A; step 2: depositing a shadow layer or seed layer in the through-hole, which may or may not include Cu etching, as illustrated in FIG. 11B; step 3: selectively etching the secondary material layer, as illustrated in FIG. 11C; step 4: forming a single-side spot face as illustrated in FIG. 11D; step 5: flash electroplating a thin metal layer, as illustrated in FIG. 11E; and step 6: electroplating a thick metal layer as illustrated in FIG. 11F.

Referring to FIG. 11A, a multilayer structure 1101 includes a top conductive layer or metal trace 1102B, a bottom conductive layer 1102C, and an inner conductive layer 1102A interleaved with insulating layers 1106. The bottom conductive layer 1102C is under one insulating layer 1106 and the top conductive layer 1102B is over another insulating layer 1106. The multilayer structure 1101 also includes a drilled through-hole 1108 through the insulating layers and the inner conductive layer 1102A. The drilled through-hole 1108 has an inner sidewall 1103.

The multilayer structure 1101 also includes a secondary material layer 1104 deposited over the inner conductive layer 1102A. The secondary material layer 1104 circumferentially surrounds the drilled through-hole 1108 to create an annular ring.

The secondary material layer 1104 is selectively applied to the conductive layer 1102A inside the PCB, which is referred to as net terminating lands. The secondary material layer has a pattern that has roughly the same shape as the net terminating land.

In some aspects, the insulating layer 106 may include a dielectric material. The conductive layers 1102A-C may include a conductive material, such as copper, among others.

In some aspects, the secondary material for the secondary material layer 1104 is different from the conductive material for the conductive layers 1102A-C. In other aspects, the secondary material can be, but is not limited to, metals, such as tin (Sn) and lead (Pb) alloy, Sn, nickel (Ni), or aluminum (AI), and the like. A portion of the secondary material may be removed to create a void by using Sn or SnPb strippers, Ni strippers, Al etchants, among other techniques.

In some aspects, the secondary material can also be organic materials that can be selectively removed without harming other PCB materials. A portion of the secondary material may also be removed to create a void by organic solvents or plasma etching, among others. The disclosed method has demonstrated using Sn/Pb as the secondary material, which had a thickness ranging from 0.0001 to 0.0050 inches, or 0.1 mils to 5.0 mils. In some aspects, thicker secondary material deposits work with the disclosed method.

Referring to FIG. 11B, a shadow layer or seed layer 1110 is deposited over the inner wall 1103 of the drilled through-hole 1108. A side portion of the shadow layer 1110 by the inner conductive layer 1102A may or may not be etched away.

Referring to FIG. 11C, a void 1112 is formed by selectively etching a portion of the secondary material layer 1104 in the through-hole 1108.

The void 1112 is created before metallization in the through-hole 1108. The void 1112 is located at a predetermined net terminating land and breaks electrical continuity to unnecessary conductor length in the plated through-hole 1108.

The thickness of the secondary material layer determines the thickness of the annular void 1112.

The void 1112 allows for segmented metallization of the plated through-hole.

In some aspects, the PWB may include at least one segment that includes the net terminating land. The one segment not including the net terminating land may not be back drilled. The net terminating land is electrically isolated with the void. Continuity has been broken by creating two or more segments 1108 A and 1108 B as shown in FIG. 11C, technically negating the need for back drilling the segment 1108A. The segment 1108B includes a net terminating land.

In some aspects, the PWB may include at least one segment 1108A that does not include the net terminating land. The one segment not including the net terminating land may be back drilled away. The segment 1108A is also referred to as a non-net terminating land portion of the plated through hole.

The void 1112 may be detected by detecting an amount of the secondary material remaining on a target pad. For example, the remnant of the secondary material may be detected by advanced material analysis techniques, including focused ion beam (FIB) and scanning electron microscopy (SEM).

Referring to FIG. 11D, a spot face 1114 is formed on top of the multilayer structure. Spot facing breaks the electrical continuity of the segment 1108A to the Cu surface of the PCB. That is necessary if one still wants to back drill the segment 1108A.

Referring to FIG. 11E, a thin metal layer 1116 is flash electroplated over the shadow layer 1110. The upper portion of the shadow layer 1110 is electrically isolated from the net terminating land. The upper portion of the shadow layer 1110 may also be removed by following Cu plating step, since it is not electrically relevant. In some aspects, the shadow layer (e.g. carbon-based material) 1110 may be removed by back drilling. In some aspects, the shadow layer 1110 may be removed by a separate chemical stripping step after flash plating.

The flash electroplated metal layer is thin enough to avoid bridging the void 1104. In some aspects, the metal may be copper. Referring to FIG. 11F, the flash plated through-hole is then plated with a thicker metal layer 1118 by electroplating. For example, the thicker metal layer may be formed of copper.

Now, a finished multilayer structure 1100 is formed to include the void 1112 that has the same thickness as the secondary material layer 1104, and stub-less plated through-hole 1108. It will be appreciated by those skilled in the art that the number of layers in the finished multilayer structure 1100 may vary. It will also be appreciated by those skilled in the art that the sequence of the steps may vary. For example, the method may flash plate the through-hole and then form a spot face, i.e. the sequence of steps 4 and 5 may be altered.

In some aspects, the drilling techniques may use the drilling tools as illustrated in FIGS. 7A-7E and described above. In some aspects, a conventional drill and any suitable drilling techniques may be used with precise depth control. The depth control can be within several mils of the net terminating land, thus significantly reducing the antennae effect.

Figures 12A, 12B, 12C, 12D, 12E, 12F, 12G:
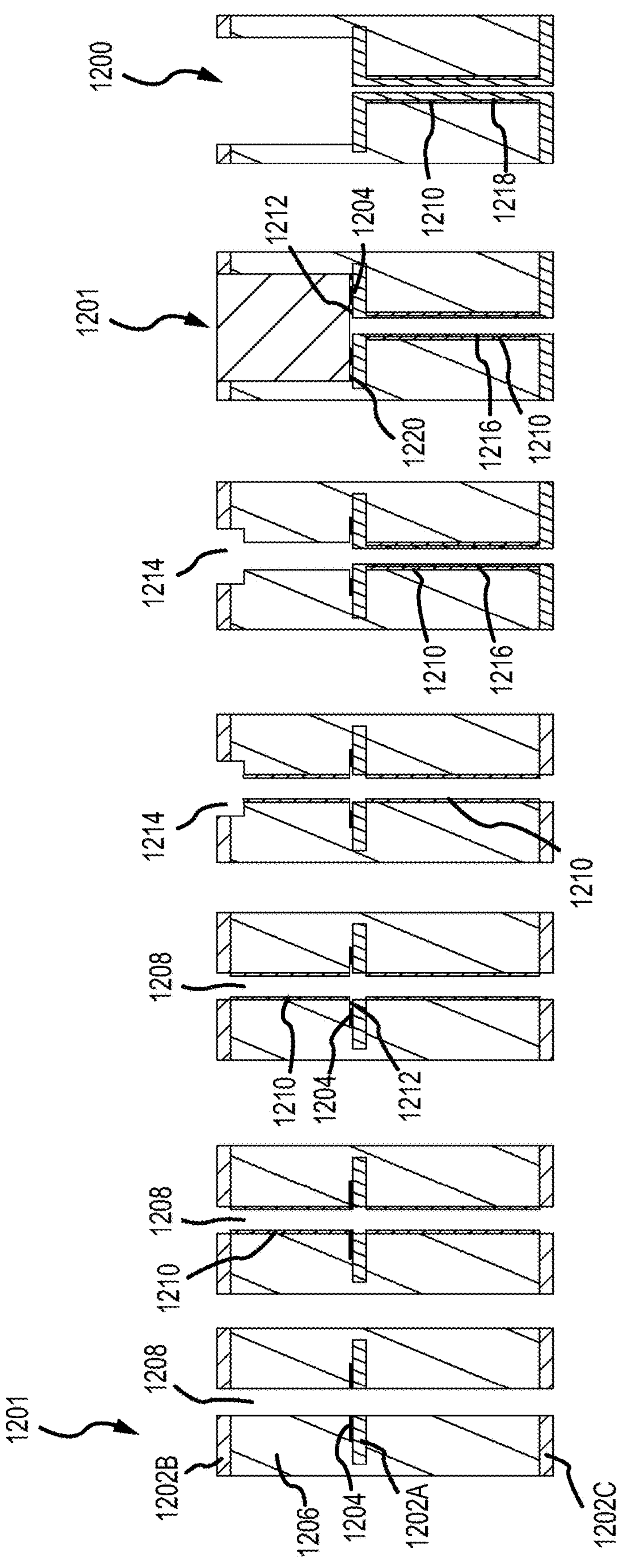
FIGS. 12A-G depict various configurations of a PCB during a method to form a single-side spot face and creating a stub-less plated through-hole and a void in a multilayer PWB and then back drilling using the drilling tool of FIGS. 7A-7E in accordance with an aspect of the disclosure.
Figures 13A, 13B, 13C, 13D, 13E, 13F, 13G:
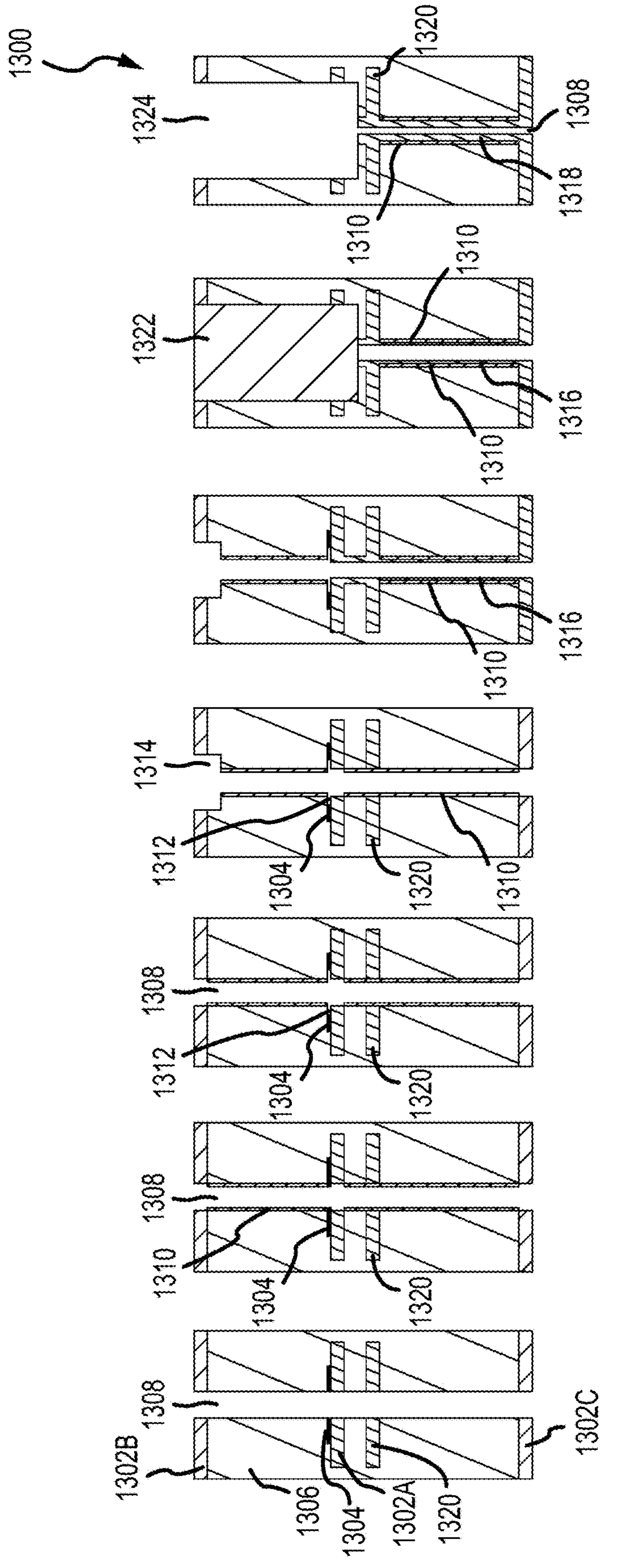
FIGS. 13A-G depict various configurations of a PCB during a method to form a multilayer structure on a bottom side and forming a single-side spot face and creating a stub-less plated through-hole and a void in a multilayer PWB and then back drilling from a top surface using the drilling tool of FIGS. 7A-7E in accordance with an aspect of the disclosure.

FIGS. 12A-G depict various configurations of a PCB during a method for forming a single-side spot face and creating a stub-less plated through-hole and a void in a multilayer PWB, and then back drilling using the drilling tool of FIGS. 7A-7E in accordance with an aspect of the disclosure. The method includes step 1: laminating and drilling a multilayer structure to form a through-hole, illustrated in FIG. 12A; step 2: depositing a shadow layer or seed layer in the through-hole and may or may not be Cu etched, as illustrated in FIG. 12B; step 3: selectively etching the secondary material layer, as illustrated in FIG. 12C; step 4: forming a single-side spot face as illustrated in FIG. 12D; step 5: flash electroplating a thin metal layer, as illustrated in FIG. 12E; step 6: back drilling to remove the secondary material layer 1204 as illustrated in FIG. 12F; and step 7: electroplating a thick metal layer as illustrated in FIG. 12G.

Steps 1-5 illustrated in FIGS. 12A-E are similar to the steps 1-5 as illustrated in FIGS. 11A-E. A multilayer structure 1201 is formed to include conductive layers 1202A-C, a secondary material layer 1204 over an inner conductive layer 1202A. The multilayer structure 1201 also includes a void 1212 that has the same thickness as the secondary material layer 1204, and stub-less plated through-hole 1208. The multilayer structure 1201 also includes a thin plated metal 1216 over a shadow layer or a seed layer 1210.

Referring to FIG. 12F, a top portion of the multilayer structure 1201 is back drilled with the drilling tool as illustrated in FIGS. 7A-E. The back drilling has a depth controlled by the tip of the drilling tool to remove the secondary material 1204.

Referring to FIG. 12G, a thicker metal layer 1218 is electroplated in the multilayer structure 1201 to form a finished multilayer structure 1200. In some aspects, the void may contain secondary metal remnants that may act as an antenna.

FIGS. 13A-G depict various configurations of a PCB during a method for adding a multilayer structure on a bottom side and forming a single-side spot face and creating a stub-less plated through-hole and a void in a multilayer PWB, and then back drilling from a top surface using the drilling tool of FIGS. 7A-7E in accordance with an aspect of the disclosure.

Steps 1-7 illustrated in FIGS. 13A-E are similar to the steps 1-7 as illustrated in FIGS. 12A-E. The main difference is that a finished multilayer structure 1300 is different from the finished multilayer structure 1200. The finished multilayer structure 1300 includes an additional lower inner conductive layer 1320 spaced apart from an upper inner conductive layer 1302A, and a secondary material layer 1304 over the upper inner conductive layer 1302A. Additional conductive layers 1302B and 1302C are on the top and bottom of the multilayer structure, respectively. The finished multilayer structure 1300 also includes a void 1312 that has the same thickness as the secondary material layer 1304, and stub-less plated through-hole 1308. The finished multilayer structure 1300 also includes a thin plated metal 1316 over a shadow layer or a seed layer 1310 and a thick plated metal 1318 over the thin plated metal 1316. The lower conductive layer 1320 is at a known distance from the upper conductive layer 1302A so that the back drilling can control the depth of drilling from the upper conductive layer 1302A to stop near the lower conductive layer 1320, ultimately creating 1324 by use of back drill 1322. Back drill 1322 can be a conventional back drill or the back drill described in FIG. 7.

Figure 14A:
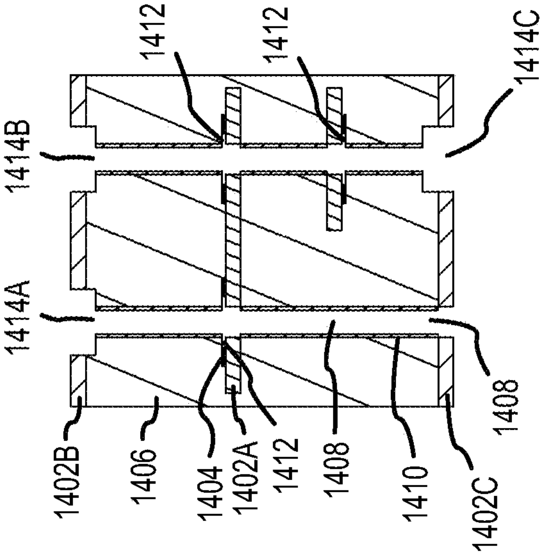
FIGS. 14A-C depict various configurations of a PCB during a method to form double-side spot faces and creating stub-less plated through-holes using voids in a multilayer PWB in accordance with an aspect of the disclosure.
Figure 14B:
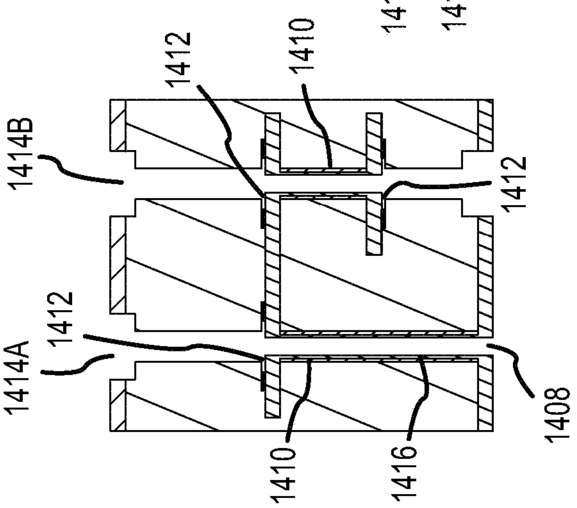
Figure 14C:
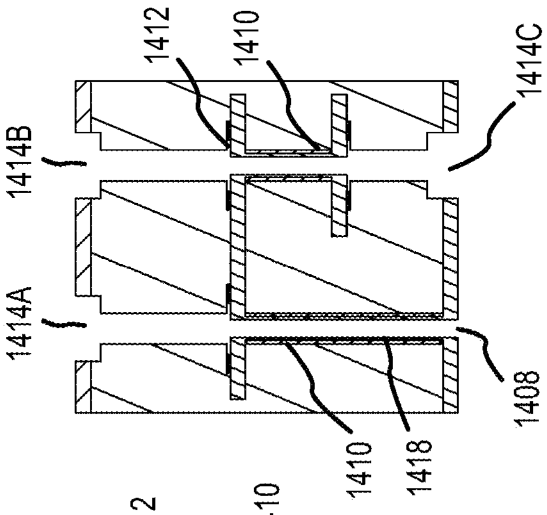

The multilayer structure may vary in design. An additional example is provided below. FIGS. 14A-C depict various configurations of a PCB during a method for forming double-side spot faces and creating stub-less plated through-holes using voids in a multilayer PWB in accordance with an aspect of the disclosure. By using similar steps to those illustrated in FIGS. 11A-C, a multilayer structure 1401 is formed to include conductive layers 1402A-C, a secondary material layer 1404, insulating layers 1406, drilled through-hole 1408, a void 1412, and a shadow layer or seed layer 1410 on an inner wall of the through-hole 1408. Referring to FIG. 14A, two top spot faces 1414A and 1414B are formed on the top and extend into the insulating layer 1406. Also, a bottom spot face 1414C is formed on a bottom opposite to the top. Also, multiple voids 1412A, 1412B, and 1412C can be formed.

Referring to FIG. 14B, a thin metal layer 1416 is electroplated into the through-hole and deposited on the shadow layer 1410 in the multiple layer structure 1401. It may be appreciated by those skilled in the art, in order to create the double sided stub-less via structure, a connection to drilled through-hole 1408 with a connection to external copper 1402C may be needed to enable the electroplating of layer 1416.

Referring to FIG. 14C, a thick metal layer 1418 is electroplated over the thin metal layer 1416 to form a finished multilayer structure 1400.

Figure 15:
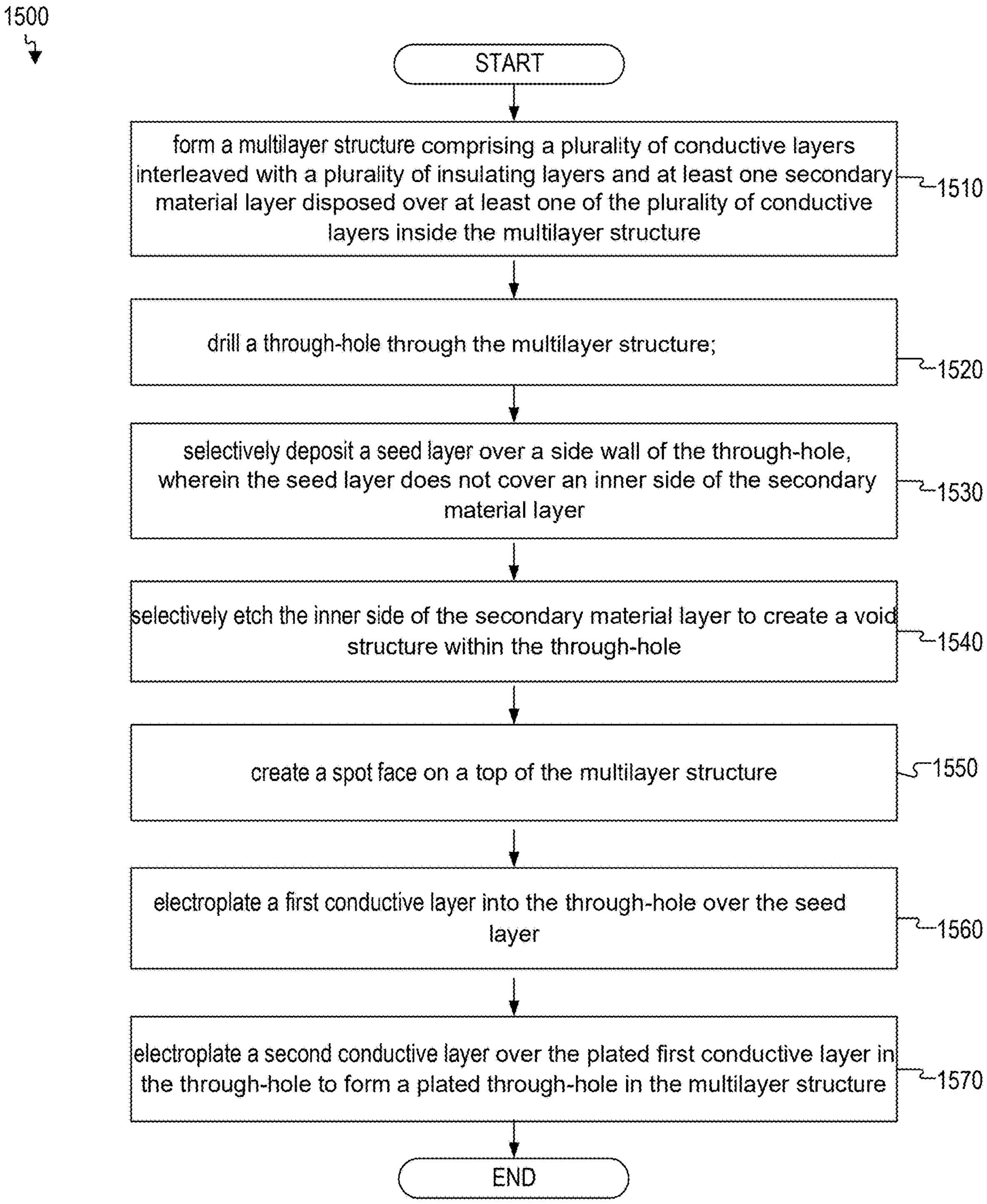
FIG. 15 is a flow chart depicting a method for creating a stub-less plated through-hole and a void in a printed wiring board (PWB) in accordance with an aspect of the disclosure.

FIG. 15 is a flow chart depicting a method for creating a stub-less plated through-hole using a void in a printed wiring board (PWB) in accordance with an aspect of the disclosure. Although the example method 1500 depicts a particular sequence of operations, the sequence may be altered without departing from the scope of the present disclosure. For example, some of the operations depicted may be performed in parallel or in a different sequence that does not materially affect the function of the method 1500. In other examples, different components of an example device or system that implement the method 1500 may perform functions at substantially the same time or in a specific sequence.

According to some examples, method 1500 includes forming a multilayer structure comprising a plurality of conductive layers interleaved with a plurality of insulating layers, and at least one secondary material layer disposed over at least one of the plurality of conductive layers inside the multilayer structure at block 1510.

According to some examples, method 1500 includes drilling a through-hole through the multilayer structure at block 1520. For example, the drilling tool illustrated in FIGS. 7A-7E may drill a through-hole through the multilayer structure.

According to some examples, method 1500 includes selectively depositing a seed layer over a sidewall of the through-hole at block 1530. The seed layer does not cover the inner side of the secondary material layer.

According to some examples, method 1500 includes selectively etching the inner side of the secondary material layer to create a void within the through-hole at block 1540.

According to some examples, method 1500 includes creating a spot face on the top of the multilayer structure at block 1550.

According to some examples, method 1500 includes electroplating a first conductive layer into the through-hole over the seed layer at block 1560.

According to some examples, method 1500 includes electroplating a second conductive layer over the plated first conductive layer in the through-hole to form a plated through-hole in the multilayer structure at block 1570.

In any of the forgoing aspects, embodiments, and examples, nano-palladium (Pd) plated through-hole seeds may be used to replace the shadow material to selectively plate the through holes. The Pd nano layer can also be used to coat the laminate and metals within the plated through-hole. The Pd nano layer can be removed by using the same processes that remove the secondary material layers 1104, 1204,1304, and 1404. Electrically, the active Pd nano layer may act as a seed layer for the following Cu plating, like the shadow material.

Having described several aspects, it will be recognized by those skilled in the art that various modifications, alternative constructions, and equivalents may be used without departing from the spirit of the disclosure. Additionally, a number of well-known processes and elements have not been described in order to avoid unnecessarily obscuring the aspects disclosed herein. Accordingly, the above description should not be taken as limiting the scope of the document.

Numerous examples and statements are provided herein to enhance understanding of the present disclosure. A specific set of statements is provided as follows:

Statement 1: A multilayer structure for a printed wiring board (PWB), the multilayer structure comprising: a plurality of insulating layers interleaved with a plurality of conductive layers comprising at least one inner conductive layer, a top conductive layer, and a bottom conductive layer; one or more stub-less plated through-holes through the plurality of insulating layers and the plurality of conductive layers; and at least one secondary material layer formed on the at least one inner conductive layer, the secondary material layer defining a void that creates a discontinuity in the plated through-hole to achieve segmented metallization of the plated through-hole.

Statement 2: The multilayer structure of claim 1, wherein the secondary material layer comprises a material different from the conductive layer.

Statement 3: The multilayer structure of claim 1, wherein the secondary material layer circumferentially surrounds a drilled through-hole, wherein the drilled through-hole is plated to form the plated through-hole and has a larger diameter than the plated through-hole.

Statement 4: The multilayer structure of claim 1, wherein the plurality of insulating layers comprise a dielectric material.

Statement 5: The multilayer structure of claim 1, wherein the plurality of conductive layers comprise copper.

Statement 6: The multilayer structure of claim 1, wherein the secondary material layer comprises a metal selected from one of a group consisting of tin (Sn) and lead (Pb) alloy, Sn, nickel (Ni), and aluminum (Al).

Statement 7: The multilayer structure of claim 1, wherein the secondary material layer comprises an organic material of higher solubility than that of the PCB laminate materials including base laminate, conductive polymers, and primary conductor material.

Statement 8: The multilayer structure of claim 1, wherein the secondary material layer has a thickness ranging from 0.1 mils to 5.0 mils.

Statement 9: The multilayer structure of claim 1, wherein the top conductive layer is over one of the plurality of insulating layers, and the bottom outer conductive layer is under another one of the plurality of insulating layers.

Statement 10: The multilayer structure of claim 1, wherein the void is located at a predetermined net terminating land.

Statement 11: The multilayer structure of claim 1, further comprising at least one segment comprising a net terminating land, wherein a stub-less via is created without the use of a back drilling step.

Statement 12: The multilayer structure of claim 1 further comprising at least one segment being a non-net terminating land portion of the plated through hole, wherein the non-net terminating land portion is removed by back drilling.

Statement 13: A method for forming stub-less plated through-hole in a PWB, the method comprising: forming a multilayer structure comprising a plurality of conductive layers interleaved with a plurality of insulating layers, and at least one secondary material layer disposed over at least one of the plurality of conductive layers inside the multilayer structure; drilling a through-hole through the multilayer structure; selectively depositing a seed layer over a sidewall of the through-hole, wherein the seed layer does not cover an inner side of the secondary material layer; selectively etching the inner side of the secondary material layer to create a void within the through-hole; creating a spot face on a top of the multilayer structure; electroplating a first conductive layer into the through-hole over the seed layer; and electroplating a second conductive layer over the plated first conductive layer in the through-hole to form a plated through-hole in the multilayer structure.

Statement 14: The method of claim 13, wherein the first conductive layer and the second conductive layer comprise copper.

Statement 15: The method of claim 13, wherein the first conductive layer is thinner than the second conductive layer to avoid bridging the void.

Statement 16: The method of claim 13, wherein the seed layer comprises a carbon-based material.

Statement 17: The method of claim 13, wherein the seed layer comprises palladium.

Statement 18: The method of claim 13, wherein the secondary material layer comprises a metal selected from one of a group consisting of Sn and Pb alloy, Sn, Ni, and Al.

Statement 19: The method of claim 13, wherein the secondary material layer comprises a material different from the conductive layer.

Statement 20: The method of claim 13, wherein the secondary material layer has a thickness ranging from 0.1 mils to 5.0 mils.

Those skilled in the art will appreciate that the presently disclosed aspects teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall there between.

What is claimed:

1. A method for forming stub-less plated through-hole in a PWB, the method comprising:

forming a multilayer structure comprising a plurality of conductive layers interleaved with a plurality of insulating layers and at least one secondary material layer disposed over at least one of the plurality of conductive layers inside the multilayer structure;

drilling a through-hole through the multilayer structure;

depositing a seed layer over a sidewall of the through-hole;

selectively removing an inner side of the secondary material layer to create a void within the through-hole to form a non-net terminating land segment of the through-hole and a segment of the through-hole including a predetermined net terminating land;

creating a spot face on a top or a bottom of the multilayer structure after depositing a seed layer over a sidewall of the through-hole, wherein the spot face is vertically aligned with the through-hole, wherein the spot face comprises a recess region extending downward or upward into the multilayer structure beyond a top conductive layer or a bottom conductive layer of the multilayer structure, the spot face configured to break an electrical continuity between the non-net terminating land segment of the through-hole and the top conductive layer or the bottom conductive layer, wherein the spot face has a larger diameter than the through-hole;

electroplating a first conductive layer into the through-hole over the seed layer on both an edge and a surface of the predetermined net terminating land; and electroplating a second conductive layer over the plated first conductive layer on both the edge and the surface of the predetermined net terminating land in the through-hole to form a segmented plated through-hole in the multilayer structure.

2. The method of claim 1, wherein the first conductive layer and the second conductive layer comprise copper.

3. The method of claim 1, wherein the first conductive layer is thinner than the second conductive layer to avoid bridging the void.

4. The method of claim 1, wherein the seed layer comprises a carbon-based material.

5. The method of claim 1, wherein the secondary material layer comprises a metal selected from one from a group consisting of Sn and Pb alloy, Sn, Ni, and Al.

6. The method of claim 1, wherein the secondary material layer comprises a material different from the first and second conductive layers.

7. The method of claim 1, wherein the secondary material layer has a thickness ranging from 0.1 mils to 5.0 mils.

8. The method of claim 1, wherein the first conductive layer or the second conductive layer comprises a material different from the secondary material layer.

9. The method of claim 1, wherein the first conductive layer is thin enough to avoid bridging the void.

10. The method of claim 1, wherein the seed layer covers an inner side of the secondary material layer.

11. A method for forming stub-less plated through-hole in a PWB, the method comprising:

forming a multilayer structure comprising a plurality of conductive layers interleaved with a plurality of insulating layers and at least one secondary material layer disposed over at least one of the plurality of conductive layers inside the multilayer structure;

drilling a through-hole through the multilayer structure;

depositing a seed layer over a sidewall of the through-hole;

selectively removing an inner side of the secondary material layer to create a void within the through-hole and to form a non-net terminating land segment including a portion of the seed layer of the through-hole and a segment of the through-hole including a predetermined net terminating land;

creating a spot face on a top or a bottom of the multilayer structure after depositing a seed layer over a sidewall of the through-hole, wherein the spot face is vertically aligned with the through-hole, wherein the spot face comprises a recess region extending downward or upward into the multilayer structure beyond a top conductive layer or a bottom conductive layer of the multilayer structure, the spot face configured to break an electrical continuity between the non-net terminating land segment of the through-hole and the top conductive layer or the bottom conductive layer, thus preventing electroplating of the non-net terminating land segment of the through-hole;

electroplating a first conductive layer into the through-hole over the seed layer on both an edge and a surface of the predetermined net terminating land; and electroplating a second conductive layer over the plated first conductive layer on both the edge and the surface of the predetermined net terminating land in the through-hole to form a segmented plated through-hole in the multilayer structure.

12. The method of claim 11, wherein the first conductive layer and the second conductive layer comprise copper.

13. The method of claim 11, wherein the first conductive layer is thinner than the second conductive layer to avoid bridging the void.

14. The method of claim 11, wherein the seed layer comprises a carbon-based material.

15. The method of claim 11, wherein the secondary material layer comprises a metal selected from one from a group consisting of Sn and Pb alloy, Sn, Ni, and Al.

16. The method of claim 11, wherein the secondary material layer comprises a material different from the first and second conductive layers.

17. The method of claim 11, wherein the secondary material layer has a thickness ranging from 0.1 mils to 5.0 mils.

18. The method of claim 11, wherein the first conductive layer or the second conductive layer comprises a material different from the secondary material layer.

19. The method of claim 11, wherein the first conductive layer is thin enough to avoid bridging the void.

20. The method of claim 11, wherein the seed layer covers an inner side of the secondary material layer.

* * * * *